United States Patent
Fukuda et al.

(10) Patent No.: US 7,467,558 B2
(45) Date of Patent: Dec. 23, 2008

(54) PIEZOELECTRIC ELEMENT COMPRISING A COVERING LAYER THAT SUPPRESSES THE ABSORPTION OF WATER AND METHOD OF MANUFACTURING THE SAME

(75) Inventors: Hirosi Fukuda, Nara (JP); Takashi Hashida, Osaka (JP); Yuko Fujii, Nara (JP); Takaiki Nomura, Osaka (JP); Shuji Itou, Nara (JP); Takahiro Sasaki, Nara (JP)

(73) Assignee: Panasonic Corporation, Osaka (JP)

( * ) Notice: Subject to any disclaimer, the term of this patent is extended or adjusted under 35 U.S.C. 154(b) by 109 days.

(21) Appl. No.: 10/570,709

(22) PCT Filed: Aug. 3, 2005

(86) PCT No.: PCT/JP2005/014184

§ 371 (c)(1),
(2), (4) Date: Mar. 6, 2006

(87) PCT Pub. No.: WO2006/046341

PCT Pub. Date: May 4, 2006

(65) Prior Publication Data

US 2007/0186689 A1    Aug. 16, 2007

(30) Foreign Application Priority Data

| Oct. 28, 2004 | (JP) | 2004-313572 |
| Oct. 28, 2004 | (JP) | 2004-313573 |
| Oct. 28, 2004 | (JP) | 2004-313575 |
| Jun. 9, 2005 | (JP) | 2005-169139 |
| Jun. 9, 2005 | (JP) | 2005-169140 |
| Jun. 9, 2005 | (JP) | 2005-169141 |

(51) Int. Cl.
*G01L 1/16* (2006.01)
*G01B 7/16* (2006.01)

(52) U.S. Cl. ....................... 73/862.68; 73/777

(58) Field of Classification Search .............. 73/862.68, 73/777
See application file for complete search history.

(56) References Cited

U.S. PATENT DOCUMENTS 3,624,465 A * 11/1971 Moore ..................... 257/200
3,985,658 A * 10/1976 Riley et al. ................... 252/7

(Continued)

FOREIGN PATENT DOCUMENTS

JP    03089799 A * 4/1991

(Continued)

OTHER PUBLICATIONS

International Search Report for application No. PCT/JP2005/014184 dated Sep. 27, 2005.
English translation of Form PCT/ISA/210.

*Primary Examiner*—Max Noori
(74) *Attorney, Agent, or Firm*—RatnerPrestia

(57) ABSTRACT

A piezoelectric element includes a piezoelectric composition pressure sensitive substance, a first electrode, a second electrode and a covering layer. The piezoelectric composition pressure sensitive substance includes a piezoelectric ceramic powder and a flexible organic polymer. The first and second electrodes are connected to the piezoelectric composition pressure sensitive substance and electrically insulated from each other. The covering layer is provided outside of the piezoelectric ceramic powder and suppresses absorption of the water by the piezoelectric ceramic powder.

14 Claims, 8 Drawing Sheets

U.S. PATENT DOCUMENTS

| | | | | |
|---|---|---|---|---|
| 4,786,837 A | * | 11/1988 | Kalnin et al. | 310/364 |
| 4,932,414 A | * | 6/1990 | Coleman et al. | 600/445 |
| 5,998,525 A | * | 12/1999 | Wang et al. | 524/425 |
| 6,140,746 A | * | 10/2000 | Miyashita et al. | 310/358 |
| 6,364,450 B1 | * | 4/2002 | Yamaguchi et al. | 347/33 |
| 7,123,549 B2 | * | 10/2006 | Robert et al. | 368/11 |

FOREIGN PATENT DOCUMENTS

| | | | |
|---|---|---|---|
| JP | 09181558 A | * | 7/1997 |
| JP | 2002-220280 A | | 8/2002 |
| JP | 2003-106910 A | | 4/2003 |
| JP | 2003-176390 A | | 6/2003 |

* cited by examiner

PIEZOELECTRIC ELEMENT COMPRISING A COVERING LAYER THAT SUPPRESSES THE ABSORPTION OF WATER AND METHOD OF MANUFACTURING THE SAME

THIS APPLICATION IS A U.S. NATIONAL PHASE APPLICATION OF PCT INTERNATIONAL APPLICATION PCT/JP2005/014184.

TECHNICAL FIELD

The present invention relates to a piezoelectric element using a piezoelectric composition pressure sensitive substance made by mixing piezoelectric ceramic powders in organic polymers. Particularly, the present invention relates to a piezoelectric element used as a flexible pressure sensitive sensor, and a method of manufacturing the same.

BACKGROUND ART

Japanese Patent Unexamined Publication No. 11-201835 discloses a piezoelectric composition pressure sensitive substance having an excellent piezoelectric property and flexibility. This piezoelectric composition pressure sensitive substance is made by mixing and kneading materials including a titanium coupling agent, a piezoelectric ceramic powder, and at least one of chlorinated polyethylene and chlorosulfonated polyethylene. The kneaded materials have flexibility because they contain a thermoplastic elastomer such as chlorinated polyethylene, so that they are processed into a sheet or cable form. The thus processed formed product is a piezoelectric composition pressure sensitive substance to which a pair of electrodes are connected so as to be used as a piezoelectric element.

However, when such a piezoelectric element is used in a high-temperature and high-humidity environment, water vapor passes through the electrodes and reaches the piezoelectric composition pressure sensitive substance. When a temperature of the inside of the piezoelectric composition pressure sensitive substance is lower than that of the outside or when water vapor becomes in a supersaturation state on the surface of the piezoelectric composition pressure sensitive substance, diffusing water vapor is condensed to generate water. Components of piezoelectric ceramic powders constituting the piezoelectric composition pressure sensitive substance or impurities are thus eluted by water. As a result, the electric property of the piezoelectric element is changed, for example, the electrostatic capacitance is increased or the electric resistance is reduced. Such changes lower the durability of the piezoelectric element. Furthermore, when the piezoelectric element is used as a sensor, a circuit for detection or control becomes complicated.

Furthermore, when the piezoelectric element absorbs water, the piezoelectric composition pressure sensitive substance itself is softened and the relation between the pressure and the distortion of the piezoelectric element is changed. Therefore, a signal processing in accordance with the change in the softness of the piezoelectric element is required, and a complicated detection circuit is required because detection error may occur.

Furthermore, since the softening of the piezoelectric element lowers the tensile strength of the piezoelectric element, the durability is deteriorated. In particular, since piezoelectric ceramic powders containing alkali metals of Group I and alkaline earth metals of Group II of the Periodic Table have a small specific resistance and are easily eluted in water, the electric resistance is remarkably lowered.

SUMMARY OF THE INVENTION

A piezoelectric element of the present invention has a piezoelectric composition pressure sensitive substance, a first electrode, a second electrode and a covering layer. The piezoelectric composition pressure sensitive substance includes piezoelectric ceramic powders and flexible organic polymers. The first and second electrodes are connected to the piezoelectric composition pressure sensitive substance and insulated from each other. The covering layer is provided outside of the piezoelectric ceramic powder and suppresses absorption of water by the piezoelectric ceramic powder. According to this configuration, even when the piezoelectric element is used in a high-temperature and high-humidity environment and water vapor is condensed to generate water inside the piezoelectric element, since a covering layer of a water-repellent material that is repellent to water is formed inside the piezoelectric element, absorption of water by the piezoelectric ceramic powders is suppressed. Thus, properties such as electric property, piezoelectric property and mechanical tensile strength of the piezoelectric element are maintained.

Figure 1:
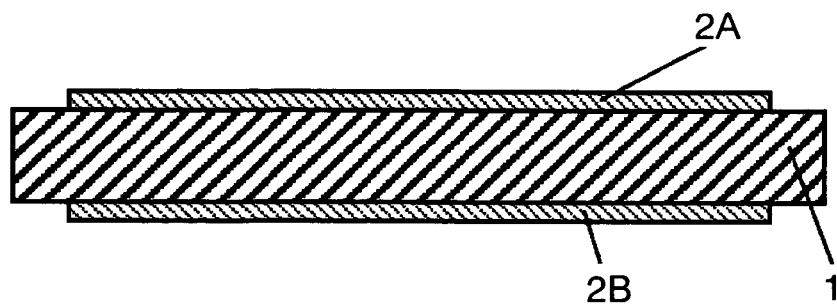
FIG. 1 is a cross-sectional view showing a sheet-like piezoelectric element in accordance with a first exemplary embodiment of the present invention.

REFERENCE MARKS IN THE DRAWINGS 1, 7, 12, 22 piezoelectric composition pressure sensitive substance
2A, 2B electrode
3 water-repellent treated piezoelectric ceramic powder
4 organic polymer
5 piezoelectric ceramic powder
6, 8, 9, 15, 16, 23, 24 covering layer
10, 14 protective layer
11 core electrode
13 external electrode

DETAILED DESCRIPTION OF THE PREFERRED EMBODIMENTS

Hereinafter, exemplary embodiments of the present invention are described with reference to drawings. In the exemplary embodiments, the same reference numerals are given to portions having the same configurations and carrying out the same operations as those in the preceding exemplary embodiments and the description thereof are omitted.

First Exemplary Embodiment

FIG. 1 is a cross-sectional view showing a sheet-like piezoelectric element in accordance with a first exemplary embodiment of the present invention. In the piezoelectric element, on both surfaces of sheet-like piezoelectric composition pressure sensitive substance (hereinafter, referred to as pressure sensitive substance) 1, electrode 2A as a first electrode and electrode 2B as a second electrode are formed. Electrode 2A and electrode 2B are electrically insulated from each other.

Figure 2:
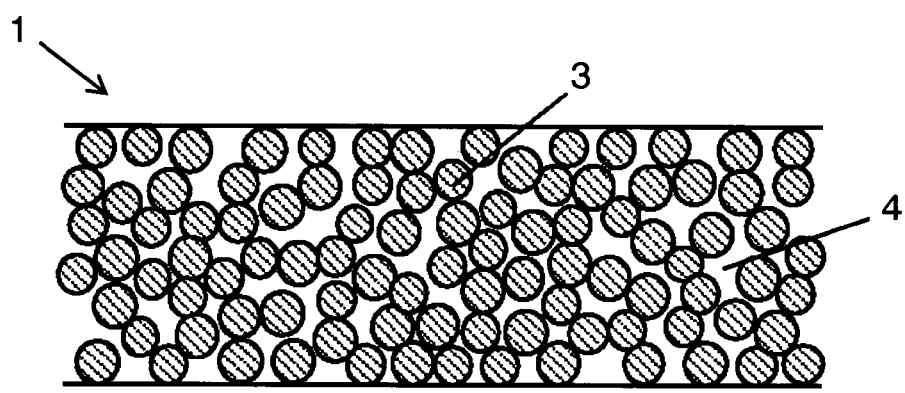
FIG. 2 is a schematic view showing a partial cross section of a piezoelectric composition pressure sensitive substance in accordance with the first exemplary embodiment of the present invention.

FIG. 2 is a schematic view showing a cross-sectional structure of pressure sensitive substance 1. Pressure sensitive substance 1 includes water-repellent treated piezoelectric ceramic powders 3 and flexible organic polymers 4. Water-repellent treated piezoelectric ceramic powders 3 and organic polymers 4 are uniformly dispersed.

Figure 3:
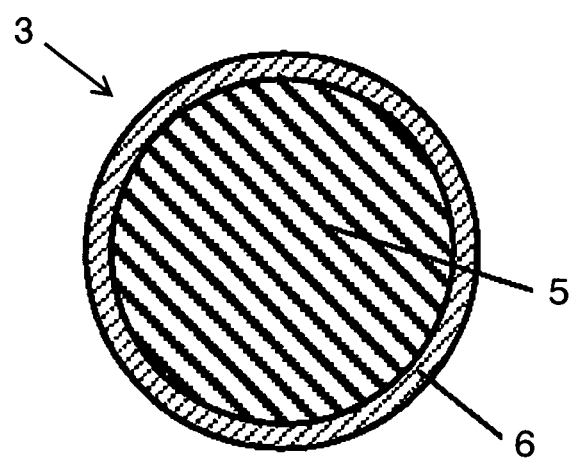
FIG. 3 is a schematic view showing a cross section of a water-repellent treated piezoelectric ceramic powder in accordance with the first exemplary embodiment of the present invention.

FIG. 3 is a schematic view showing a cross section of one water-repellent treated piezoelectric ceramic powder 3. Water-repellent treated piezoelectric ceramic powder 3 has covering layer 6 provided by carrying out a water-repellent treatment on the surface of piezoelectric ceramic powder 5.

Figure 4:
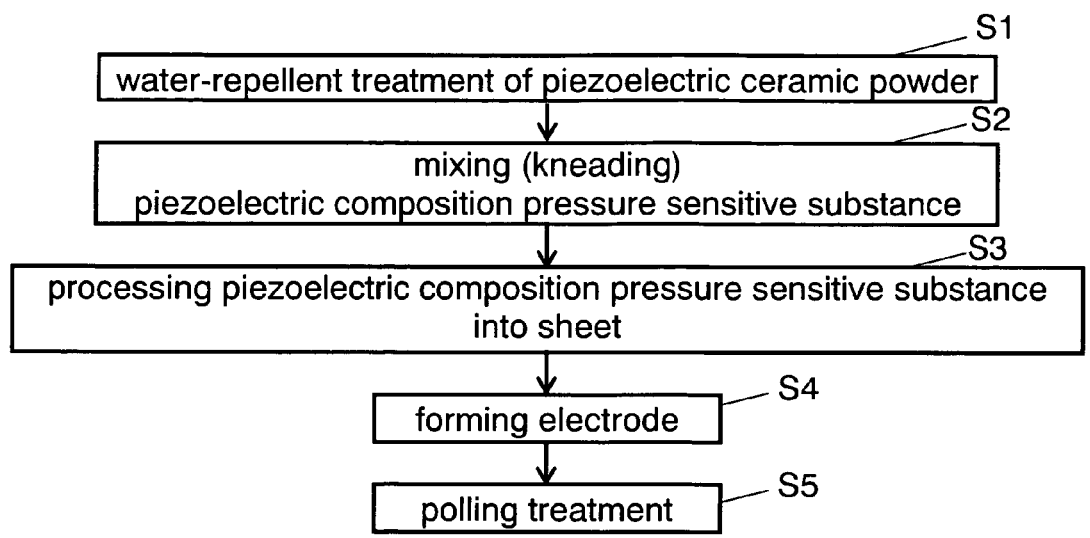
FIG. 4 is a diagram to illustrate a manufacturing process of a piezoelectric element using the piezoelectric composition pressure sensitive substance in accordance with the first exemplary embodiment of the present invention.

Next, a method of manufacturing a piezoelectric element in accordance with this exemplary embodiment is described with reference to FIG. 4. Firstly, covering layer 6 provided by carrying out a water-repellent treatment is formed on piezoelectric ceramic powder 5 (S1). Herein, piezoelectric ceramic powder 5 is soaked in a solution containing a water-repellent material, which has been adjusted to a predetermined concentration by diluting with an appropriate solvent.

Next, water-repellent treated piezoelectric ceramic powders 3 and organic polymers 4 are kneaded (S2). At this time, by using a processor such as a kneader, a roll, or the like, kneading is carried out so that water-repellent treated piezoelectric ceramic powders 3 are uniformly mixed and dispersed in organic polymers 4. Furthermore, at this time, in order to improve kneading, a titanium coupling agent may be added.

Next, this kneaded product is processed by using a processor such as a roll, a hot press, or the like, so as to form sheet-like pressure sensitive substance 1 (S3). Then, on the both surfaces of pressure sensitive substance 1, a conductive paste or a conductive coating material obtained by mixing conductive powders and organic polymers is coated so as to form electrodes 2A and 2B which are electrically insulated from each other (S4). Electrodes 2A and 2B may be formed by fusion-bonding a conductive sheet formed by mixing and diffusing conductive powders into flexible organic polymers such as rubber and a thermoplastic elastomer. Alternatively, electrodes 2A and 2B may be formed by vapor-depositing a conductive material.

Thereafter, in order to allow the piezoelectric property to be expressed, a poling treatment is carried out by applying a direct voltage between electrodes 2A and 2B in the air or in a silicon oil bath (S5), and thus a sheet-like piezoelectric element is formed. The poling treatment (S5) is carried out after electrodes 2A and 2B are formed (S4), but it may be carried out by using two dummy electrodes after sheet-like pressure sensitive substance 1 is formed (S3).

Hereinafter, the operation and the effect of the sheet-like piezoelectric element configured as mentioned above are described. The piezoelectric property of the piezoelectric element is expressed by carrying out a poling treatment with respect to pressure sensitive substance 1 by applying a high direct voltage between electrodes 2A and 2B as mentioned above. When pressure that changes over time is applied to a part or an entire surface of the sheet-like piezoelectric element expressing a piezoelectric property, oscillatory voltage according to acceleration generated therein is induced between electrodes 2A and 2B. Pressure can be detected by using this induced voltage.

Therefore, the piezoelectric element of this exemplary embodiment can be used as a pressure sensitive sensor and a vibration sensor. Furthermore, by providing the piezoelectric element of this exemplary embodiment in an automobile door, it can be used as a sensor for detecting something caught in the door, or by providing it in a care bed, it can be used as a sensor for detecting body motion. Such pressure sensitive sensors may be used outside as a pressure sensitive sensor or a vibration sensor. Furthermore, in a state in which such a sensor is mounted on an automobile, it is highly likely to be used in a high-temperature and high-humidity environment in the rain in summer. Furthermore, when such a sensor is incorporated in a care bed, it is highly likely to be used in a moist environment by incontinence or sweat, or a high-temperature and high-humidity environment in washing and cleaning to keep sanitation.

In the piezoelectric element of this exemplary embodiment, covering layer 6 formed by carrying out a water-repellent treatment is provided on piezoelectric ceramic powder 5 forming pressure sensitive substance 1. Therefore, even when water vapor is condensed to generate water inside pressure sensitive substance 1, elution of components of piezoelectric ceramic powder 5 or impurities by infiltrated water is suppressed. That it to say, covering layer 6 suppress absorption of water by piezoelectric ceramic powder 5.

Therefore, increase in the electrostatic capacitance and decrease in the electric resistance in a piezoelectric element are prevented. As a result, the initial electric property of the piezoelectric element can be maintained and excellent durability and reliability are realized. Furthermore, since the change in the electric property is prevented, a circuit configuration for correcting the change in the electric property is not required, and a pressure sensitive sensor with high reliability can be obtained.

In particular, since covering layer 6 formed by carrying out a water-repellent treatment is formed on each piezoelectric ceramic powder 5, water and piezoelectric ceramic powder 5 are hardly brought into contact with each other. Therefore, the effect of preventing the reduction in the electric resistance caused by the elution of components of piezoelectric ceramic powder 5 in water is large.

Furthermore, when the piezoelectric element of this exemplary embodiment is used as a pressure sensitive sensor, since covering layer 6 prevents absorption of water by pressure sensitive substance 1, pressure sensitive substance 1 can be suppressed from being softened. Thus, the initial piezoelectric property can be always maintained. As a result, since a signal processing according to the change in the piezoelectric property when the same pressure is applied, is not required, it is possible to design a detection circuit and a control circuit having a high reliability, for example, being capable of preventing error detection.

Furthermore, since pressure sensitive substance 1 forming a piezoelectric element can be suppressed from being softened, the tensile strength of pressure sensitive substance 1 can be prevented from being reduced and the initial strength can be maintained. Thus, excellent durability can be realized.

Furthermore, since a hydrophobic property is expressed on the surface of piezoelectric ceramic powder 5 by covering layer 6, piezoelectric ceramic powder 5 is compatible with water-repellent organic polymer 4 excellently. As a result, kneading property thereof is improved, and thus the productivity is improved, for example, the kneading processing time is shortened. Furthermore, when the kneading time is the same as the conventional time, the amount of titanium coupling agents used for improving the kneading can be reduced, and thus the cost of materials can be reduced.

Furthermore, by carrying out a water-repellent treatment to piezoelectric ceramic powder 5 in advance, even if the shape or the size of the piezoelectric element is changed, a water-repellent treating process in accordance with such changes is not required and the productivity of the piezoelectric element is increased. Furthermore, regardless with the shape and the size of the piezoelectric element, a water-repellent effect, which is always stable, can be exhibited.

Examples of the water-repellent material for covering layer 6 can include a material containing an organic fatty acid salt, an organic fatty acid amide, fluororesin, silicone resin, acrylic resin and a silane compound as a main component.

Examples of the organic fatty acid salt can include a compound of fatty acid such as caprylic acid, pelargonic acid, capric acid, undecylic acid, lauric acid, tridecylic acid, myristic acid, pentadecylic acid, palmitic acid, heptadecylic acid, stearic acid, nonadecanoic acid, arachidic acid, behenic acid, lignoceric acid, cerotic acid, heptacosanoic acid, montanoic acid, acrylic acid, crotonic acid, isocrotonic acid, undecylenic acid, oleic acid, elaidic acid, cetoleic acid, erucic acid, brassidic acid, sorbic acid, linoleic acid, and linolenic acid, and metallic element such as calcium, zinc, sodium, potassium, magnesium, copper and lead. At least one fatty acid salt thereof is used.

Examples of the organic fatty acid amide can include compounds in which a hydrogen group in fatty acids is substituted by an amino group. The fatty acids include caprylic acid, pelargonic acid, capric acid, undecylic acid, lauric acid, tridecylic acid, myristic acid, pentadecylic acid, palmitic acid, heptadecylic acid, stearic acid, nonadecanoic acid, arachidic acid, behenic acid, lignoceric acid, cerotic acid, heptacosanoic acid, montanoic acid, acrylic acid, crotonic acid, isocrotonic acid, undecylenic acid, oleic acid, elaidic acid, cetoleic acid, erucic acid, brassidic acid, sorbic acid, linoleic acid, and linolenic acid.

Examples of the fluororesin can include polytetrafluoroethylene (PTFE) and perfluoroalkylethylacrylate; examples of the silicone resin can include dimethylpolysiloxane, diethylpolysiloxane and a silicone-acrylic block copolymer; and examples of the acrylic resin can include a polymer of methacrylic acid ester and acrylic acid ester.

Examples of the silane compound can include a alkylsilane compound and a fluorosilane compound having at least a siloxane bond on the surface of piezoelectric ceramic powder 5 and at least an alkyl group or a fluoroalkyl group. As the silane compounds, the following compounds are effective.

(1) $SiX_4$
(2) $SiX_3$—O—$SiX_3$

Further specific examples of the compounds can include:

(3) $Si(OC_2H_5)_4$
(4) $Si(OCH_3)_3$—O—$Si(OCH_3)_3$
(5) $Si(OC_2H_5)_3$—O—$Si(OCH_3)_3$
(6) $Si(OC_2H_5)_3$—O—$Si(OC_2H_5)_3$
(7) $Si(NCO)_4$
(8) $Si(NCO)_3$—O—$Si(NCO)_3$
(9) $SiCl_4$
(10) $SiCl_3$—O—$SiCl_3$

Examples of the silane compounds can include:

(11) $SiY_pCl_{4-p}$
(12) $CH_3(CH_2)_sO(CH_2)_tSiY_qCl_{3-q}$
(13) $CH_3(CH_2)_u$—$Si(CH_3)_2(CH_2)_v$—$SiY_qCl_{3-q}$
(14) $CF_3COO(CH_2)_wSiY_qCl_{3-q}$ wherein, p denotes an integer from 1 to 3; q denotes an integer from 0 to 2; r denotes an integer from 1 to 25; s denotes an integer from 0 to 12; t denotes an integer from 1 to 20; u denotes an integer from 0 to 12; v denotes an integer from 1 to 20; and w denotes an integer from 1 to 25. Furthermore, X is halogen; Y is hydrogen, an alkyl group, an alkoxyl group, a fluoroalkyl group or a fluoro alkoxy group.

Furthermore, specific silane-based compounds can include the following (15) to (21).

(15) $CH_3CH_2O(CH_2)_{15}SiCl_3$
(16) $CH_3(CH_2)_2Si(CH_3)_2(CH_2)_{15}SiCl_3$
(17) $CH_3(CH_2)_6Si(CH_3)_2(CH_2)_9SiCl_3$
(18) $CH_3COO(CH_2)_{15}SiCl_3$
(19) $CF_3(CF_2)_7—(CH_2)_2—SiCl_3$
(20) $CF_3(CF_2)_5—(CH_2)_2—SiCl_3$
(21) $CF_3(CF_2)_7—C_6H_4—SiCl_3$

Furthermore, instead of the above-mentioned chlorosilane-based compound, an isocyanate-based compound in which all chlorosilyl groups are substituted by an isocyanate group, for example, compounds shown in the following (22) to (26) may be used.

(22) $SiY_p(NCO)_{4-p}$
(23) $CH_3—(CH_2)_rSiY_p(NCO)_{3-p}$
(24) $CH_3(CH_2)_sO(CH_2)_tSiY_q(NCO)_{q-p}$
(25) $CH_3(CH_2)_u—Si(CH_3)_2(CH_2)_v—SiY_q(NCO)_{3-q}$
(26) $CF_3COO(CH_2)_vSiY_q(NCO)_{3-q}$ wherein p, q, r, s, t, u, v and Y are the same as mentioned above.

Instead of the above-mentioned silane-based compound, silane-based compounds specifically shown in the following (27) to (33) may be used.

(27) $CH_3CH_2O(CH_2)_{15}Si(NCO)_3$
(28) $CH_3(CH_2)_2Si(CH_3)_2(CH_2)_{15}Si(NCO)_3$
(29) $CH_3(CH_2)_6Si(CH_3)_2(CH_2)_9Si(NCO)_3$
(30) $CH_3COO(CH_2)_{15}Si(NCO)_3$
(31) $CF_3(CF_2)_7—(CH_2)_2—Si(NCO)_3$
(32) $CF_3(CF_2)_5—(CH_2)_2—Si(NCO)_3$
(33) $CF_3(CF_2)_7—C_6H_4—Si(NCO)_3$

Furthermore, as a silane-based compound, a material generally represented by $SiY_k(OA)_{4-k}$ (Y is the same as mentioned above, A is an alkyl group and k is 0, 1, 2 or 3) can be used. Among them, when a material represented by $CF_3—(CF_2)_n—(R)_l—SiY_q(OA)_{3-q}$ (n denotes an integer of 1 or more, preferably an integer from 1 to 22; R is an alkyl group, a vinyl group, an ethynyl group, an aryl group or a substitutent including silicon or oxygen atom; l is 0 or 1; Y, A and q are the same as those mentioned above) is used, a coating film having more excellent antifouling property can be formed. However, materials to be used are not limited to these materials. In addition to these materials, $CH_3—(CH_2)_r—SiY_q(OA)_{3-q}$, $CH_3—(CH_2)_s—O—(CH_2)_t—SiY_q(OA)_{3-q}$, $CH_3—(CH_2)_u—Si(CH_3)_2—(CH_2)_v—SiY_q(OA)_{3-q}$, $CF_3COO—(CH_2)_v—SiY_q(OA)_{3-q}$, and the like, can be used. Herein, q, r, s, t, u, v, Y and A are the same as mentioned above.

Furthermore, more specific examples of the silane-based compound can include the following (34) to (57).

(34) $CH_3CH_2O(CH_2)_{15}Si(OCH_3)_3$
(35) $CF_3CH_2O(CH_2)_{15}Si(OCH_3)_3$
(36) $CH_3(CH_2)_2Si(CH_3)_2(CH_2)_{15}Si(OCH_3)_3$
(37) $CH_3(CH_2)_6Si(CH_3)_2(CH_2)_9Si(OCH_3)_3$
(38) $CH_3COO(CH_2)_{15}Si(OCH_3)_3$
(39) $CF_3(CF_2)_5(CH_2)_2Si(OCH_3)_3$
(40) $CF_3(CF_2)_7—C_6H_4—Si(OCH_3)_3$
(41) $CH_3CH_2O(CH_2)_{15}Si(OC_2H_5)_3$
(42) $CH_3(CH_2)_2Si(CH_3)_2(CH_2)_{15}Si(OC_2H_5)_3$
(43) $CH_3(CH_2)_6Si(CH_3)_2(CH_2)_9Si(OC_2H_5)_3$
(44) $CF_3(CH_2)_6Si(CH_3)_2(CH_2)_9Si(OC_2H_5)_3$
(45) $CH_3COO(CH_2)_{15}Si(OC_2H_5)_3$
(46) $CF_3COO(CH_2)_{15}Si(OC_2H_5)_3$
(47) $CF_3COO(CH_2)_{15}Si(OCH_3)_3$
(48) $CF_3(CF_2)_9(CH_2)_2Si(OC_2H_5)_3$
(49) $CF_3(CF_2)_7(CH_2)_2Si(OC_2H_5)_3$
(50) $CF_3(CF_2)_5(CH_2)_2Si(OC_2H_5)_3$
(51) $CF_3(CF_2)_7C_6H_4Si(OC_2H_5)_3$
(52) $CF_3(CF_2)_9(CH_2)_2Si(OCH_3)_3$
(53) $CF_3(CF_2)_5(CH_2)_2Si(OCH_3)_3$
(54) $CF_3(CF_2)_7(CH_2)_2SiCH_3(OC_2H_5)_2$
(55) $CF_3(CF_2)_7(CH_2)_2SiCH_3(OCH_3)_2$
(56) $CF_3(CF_2)_7(CH_2)_2Si(CH_3)_2OC_2H_5$
(57) $CF_3(CF_2)_7(CH_2)_2Si(CH_3)_2OCH_3$

The use of the compounds represented by (22) to (57) has merits in terms of maintaining apparatus and workability because no hydrochloric acid is generated.

Note here that by using such materials, covering layer 6 can be formed in a form of a monomolecular layer. The monomolecular layer is an ultra-thin film having a thickness of several nm level. Therefore, after pressure sensitive substance 1 is formed, when a high direct voltage is applied in a poling treatment that is carried out for allowing the piezoelectric property to be expressed, voltage drop is reduced. That is to say, the efficiency of poling can be improved, treatment time can be shortened and an excellent piezoelectric property can be realized. Furthermore, by forming covering layer 6 in a form of a monomolecular layer, the amount of the water-repellent material to be used can be remarkably reduced, and therefore the cost of a piezoelectric element can be lowered. Forming covering layers in a form of monomolecular layers is preferable also in the below-mentioned other exemplary embodiments.

Furthermore, it is preferable to use a water-repellent material having a contact angle with respect to distilled water of at least 125° for covering layer 6. Thus, the changes in the electric property, piezoelectric property and mechanical strength of a piezoelectric element in a high-temperature and high-humidity environment can be remarkably reduced. This is thought to be because such a water-repellent material can have a high water-repellent property with respect to condensed water even in a high temperature environment. Note here that, since a contact angle is less than 180° by definition, a water-repellent material having a contact angle with respect to distilled water of at least 125° and less than 180° is preferred. A super water-repellent material having a contact angle with respect to distilled water of at least 150° is desired. Such a preferable range of the contact angle is the same as in the covering layers in the below mentioned other exemplary embodiments.

Examples of the water-repellent material having a contact angle of covering layer 6 with respect to distilled water of at least 150° can include the above-mentioned fatty acid salt, fatty acid amide, fluororesin, silicone resin, and a silane compound. As to fatty acid salt, in particular, one containing calcium is excellent in the water-repellent property. The reason therefor is not clear but it is thought to be as follows.

Since pressure sensitive substance 1 formed by using water-repellent material of fatty acid calcium is softer than that using water-repellent material of fatty acid salt of other than calcium, it exhibits an excellent kneading property even in the same kneading condition. Since the kneading property is excellent, water-repellent treated piezoelectric ceramic powders 3 are uniformly dispersed in organic polymers 4.

That it to say, piezoelectric ceramic powders 5 are uniformly coated not only with covering layer 6 of water-repellent material but also with organic polymers 4, thus realizing more excellent water-repellent property.

As mentioned above, piezoelectric ceramic powders 5 are soaked in a solution containing a water-repellent material in S1, which has been adjusted to a predetermined concentration by diluting with an appropriate solvent. Then, the piezoelectric ceramic powders 5 after soaking are dried so as to form water-repellent treated piezoelectric ceramic powders 3. Beside this, piezoelectric ceramic powder 5 may be soaked in a solution of a water-repellent material heated to a melting temperature. In the case where the water-repellent material is a solid, water-repellent treated piezoelectric ceramic powders 3 may be formed by mixing piezoelectric ceramic powders 5 with a predetermined amount of powders of water-repellent material. The water-repellent material may be used singly or in combination of two or more kinds thereof.

As a solvent suitable for a silane compound, it is preferable to use a non-aqueous solvent without containing active hydrogen. A hydrocarbon solvent, a carbon fluoride solvent, a silicone-based solvent, and the like, which do not contain water, can be used. Note here that other examples of a petroleum solvent that can be specifically used include petroleum naphtha, solvent naphtha, petroleum ether, petroleum benzine, isoparaffin, normal paraffin, decalin, industrial gasoline, kerosene, ligroin, dimethyl silicone, phenyl silicone, alkylyl-modified silicone, polyester silicone, and the like. Examples of the carbon fluoride solvent include a fluorocarbon solvent, perfluorooctane, tris-perfluoro n-butylamine-based solvent, and the like. Note here that such a solvent may be used singly or in combination of two or more of them in the case where they are mixed well.

Even when a water-repellent material is added to piezoelectric ceramic powders 5 and organic polymers 4 to mix and disperse them by using a processor such as a kneader or a roll, each of the particles of piezoelectric ceramic powders 5 cannot completely be coated with the water-repellent material, respectively. Accordingly, an excellent water-repellent property cannot be obtained. Therefore, in order to realize an excellent water-repellent property, it is necessary to provide covering layer 6 on each surface of the particles of piezoelectric ceramic powders 5.

For piezoelectric ceramic powder 5, a compound having a perovskite structure, for example, lead titanate, lead zirconate, lead zirconate titanate, bismuth sodium titanate, barium titanate, alkaline niobate, and the like; a compound having a bismuth layer structure; and a compound having a tungsten bronze structure, and the like, can be used. These materials are ceramic materials expressing the piezoelectric property by a poling treatment.

When piezoelectric ceramic powders 5 are brought into contact with an electrolyte such as water, components of piezoelectric ceramic powders 5 or impurities contained in piezoelectric ceramic powder 5 are eluted. A compound having a perovskite structure containing at least one of an element of Group I of the Periodic Table and an element of Group IIA of the Periodic Table which contain an alkaline component, especially a compound of bismuth sodium titanate, barium titanate, sodium niobate, and potassium niobate contains alkaline components that are easily eluted into water. Therefore, in a high-temperature and high-humidity environment, many alkaline components are eluted, thus increasing the change in the electric property. Furthermore, the specific resistance of a piezoelectric ceramic containing an alkaline component is lower than that of, for example, lead zirconate titanate. Therefore, when the alkaline component is eluted, the absolute value of the electric resistance is further lowered, a circuit with a configuration in which pressure is detected by always applying a constant voltage to the piezoelectric element cannot be used as a pressure sensitive sensor. In this exemplary embodiment, since covering layer 6 formed by carrying out a water-repellent treatment is provided on piezoelectric ceramic powder 5, the elution of the alkaline components can be suppressed and thus the remarkable reduction in the electric resistance can be prevented. Therefore, the circuit with the configuration in which pressure is detected by always applying a constant voltage to the piezoelectric element can be used as a sensor and have high practicality. Thus, the configuration according to this exemplary embodiment is particularly effective in the case where a material containing an alkaline component is used for piezoelectric ceramic powder 5.

Furthermore, it is preferable to use a compound containing at least one of bismuth sodium titanate, barium titanate, sodium niobate, and potassium niobate as a main component for piezoelectric ceramic powder 5. In this configuration, even if a piezoelectric element is disposed of and exposed to an environment such as acid rain, no lead is eluted. Thus, environment pollution may not occur. Since piezoelectric ceramic powder 5 is provided with covering layer 6 to prevent the elution of components of piezoelectric ceramic powder 5, the elution of metal other than lead can be suppressed and the safety is further improved.

The piezoelectric property is expressed by carrying out a poling treatment by applying a high direct voltage between electrodes. The piezoelectric property that is important when the piezoelectric element according to this exemplary embodiment is used as a pressure sensitive sensor is a voltage output constant as an index of generated voltage.

Pressure sensitive substance 1 is made of a composite material of piezoelectric ceramic powders 5 and organic polymers 4. The relative permittivity (the value of dielectric constant of material divided by vacuum dielectric constant) of piezoelectric ceramic powder 5 is several hundreds to several thousands. Meanwhile, the relative permittivity of organic polymer 4 is about several tens. A direct voltage applied at the poling treatment is distributed in inverse proportion to the ratio of the dielectric constant of piezoelectric ceramic powder 5 to that of organic polymer 4. Therefore, a higher direct voltage is applied to organic polymer 4. In other words, when the same material is used as organic polymer 4, the higher the dielectric constant of piezoelectric ceramic powder 5 is, the higher the voltage applied to organic polymer 4 is.

Herein, comparison is made between the case where lead zirconate titanate having a relative permittivity of about 2000 is used as piezoelectric ceramic powder 5 and the case where bismuth sodium titanate having a relative permittivity of about 600 is used as piezoelectric ceramic powder 5. When a same direct voltage is respectively applied to both pressure sensitive substances 1, higher voltage is applied and a polling efficiency becomes higher in bismuth sodium titanate having a lower relative permittivity than in lead zirconate titanate. Accordingly, a voltage output constant is increased. That is to say, when the piezoelectric element is used as a pressure sensitive sensor, an output voltage of the sensor with respect to the applied pressure is higher, and the sensitivity is improved. Furthermore, since the amplification factor of a detection circuit can be lowered in accordance with the increase in the sensitivity, a pressure sensitive sensor that is strong to electrical noise can be obtained.

It is preferable that the relative permittivity of piezoelectric ceramic powder 5 is as low as possible. When the relative permittivity is not more than 1000, voltage output constant that is at least three times excellent can be obtained as compared with the case where piezoelectric ceramic powder 5 of lead zirconate titanate is used. From this point, examples of useful piezoelectric ceramic powder 5 include one containing bismuth sodium titanate, barium titanate, sodium niobate, or potassium niobate as main component.

That is to say, it is preferable that the relative permittivity of piezoelectric ceramic powder 5 is more than 0 and at most 1000. Since a material having the practically lowest relative permittivity is sodium niobate (relative permittivity thereof is 120), it is preferable that the relative permittivity of piezoelectric ceramic powder 5 is at least 120 and at most 1000. Such a preferable range of the relative permittivity is also applied to the below-mentioned other exemplary embodiments.

Furthermore, less free alkaline components remain in piezoelectric ceramic powder 5 composed of bismuth sodium titanate or barium titanate than in that composed of sodium niobate or potassium niobate. Therefore, the amount of alkaline components eluted through covering layer 6 is further reduced, and the change in the electric property is reduced.

On the other hand, piezoelectric ceramic powder 5 composed of sodium niobate or potassium niobate has lower relative permittivity than that composed of lead titanate, lead zirconate, lead zirconate titanate, bismuth sodium titanate or barium titanate. Therefore, when pressure sensitive substance 1 is formed and a poling treatment is carried out in order to express the piezoelectric property, a direct voltage applied to piezoelectric ceramic powder 5 becomes high, and voltage output constant becomes high.

In this way, materials used for piezoelectric ceramic powder 5 may be appropriately selected in accordance with an environment in which the piezoelectric element is used and the sensitivity to be required.

For electrodes 2A and 2B, a conductive layer is used, which is formed by extrusion molding a flexible conductive composition made by kneading conductive powders and flexible organic polymers such as rubber and a thermoplastic elastomer as mentioned above. Examples of materials for the conductive powder can include a powder containing at least one of carbon (C), platinum (Pt), gold (Au), palladium (Pd), silver (Ag), copper (Cu), aluminum (Al) and nickel (Ni). Alternatively, a conductive film formed by coating a conductive coating material (paste), in which these conductive powders are diffused in organic polymers, may be used. A thin vapor-deposited film may be used, which is obtained by forming at least one of the above listed materials on pressure sensitive substance 1 by a method such as vacuum deposition, sputtering, CVD, and the like. A conductive layer made of a conductive film may be used. In the conductive film, a foil of at least one of C, Pt, Au, Pd, Ag, Cu, Al, and Ni is allowed to adhere to both surfaces of the polymer film such as a polyethylene terephthalate film, and both surfaces are conducting to each other.

Examples of flexible organic polymer 4 can include a material containing at least one of a thermoplastic elastomer and rubber. These flexible organic polymers 4 provide a piezoelectric element with excellent elasticity and flexibility. Therefore, the piezoelectric element can obtain large repulsion and amount of displacement with respect to the applied pressure and improves the piezoelectric property. In particular, when chlorinated polyethylene or chlorosulfonated polyethylene is used as a thermoplastic elastomer, since the content of piezoelectric ceramic powders 5 in pressure sensitive substance 1 can be increased, the piezoelectric property of the piezoelectric element is improved.

In addition to organic polymer 4, a titanium coupling agent may be used. The titanium coupling agent covers water-repellent treated piezoelectric ceramic powder 3 and provides a hydrophobic side-chain organic functional group at the outside. Thus, the compatibility (wettability) with respect to organic polymer 4 is improved and the entire viscosity is decreased. The processability, flexibility and further, diffusing property of water-repellent treated piezoelectric ceramic powders 3 are improved. Therefore, the expression of the piezoelectric property is significantly improved.

In particular, it is preferable to use isopropoxytriisostearoyl titanate or isopropoxytris-dioctylpyrophosphate titanate as a titanium coupling agent. When chlorinated polyethylene or chlorosulfonated polyethylene is used as organic polymer 4 and the above-mentioned titanium coupling agent is used, the compatibility with respect to water-repellent treated piezoelectric ceramic powder 3 is further improved. Therefore, shortening of a kneading processing time, improvement of the piezoelectric property, stabilization of the piezoelectric property, and improvement of the flexibility can be realized. Furthermore, pressure sensitive substance 1 can be easily molded into an arbitrary shape such as a sheet-like shape, a cable-like shape, and the like.

Note here that the SP values (solubility parameters) of isopropoxytriisostearoyl titanate and isopropoxytris-dioctylpyrophosphate titanate is 8 to 9. On the other hand, the SP values of chlorinated polyethylene and chlorosulfonated polyethylene is from 9 to 9.5. It is thought that the similarity of the both SP values makes the compatibility of the kneading materials excellent.

Hereinafter, the above-mentioned configuration and the effect thereof are described with reference to specific examples. As piezoelectric ceramic powder 5, a solid solution of bismuth sodium titanate and barium titanate, $(Bi_{1/2}Na_{1/2})_{0.85}Ba_{0.15}TiO_3$, having an average particle diameter of about 1 μm is used. Then, by using the below-mentioned water-repellent material, a water-repellent treatment is carried out on the surface of piezoelectric ceramic powder 5 to form covering layer 6, and thus water-repellent treated piezoelectric ceramic powder 3 is formed.

For the water-repellent material, four kinds of materials, that is, calcium oleate (fatty acid salt), polytetrafluoroethylene (fluororesin), heptadecafluorodecyltrichlorosilane (silane compound) and methacrylic acid ester (acrylic resin) are used. Calcium oleate is used in a form of a heated and melted liquid. Polytetrafluoroethylene is used in a form of a solution diluted with a methyl ethyl ketone solvent. Heptadecafluorodecyltrichlorosilane is used in a form of a solution containing a hexamethylsiloxane solvent. Methacrylic acid ester is used in a form of a solution diluted with a xylene solvent. A water-repellent treatment is carried out by soaking piezoelectric ceramic powder 5 in these solutions or liquids, respectively, and then drying thereof to form covering layer 6.

Next, four kinds of water-repellent treated piezoelectric ceramic powders 3 and chlorinated polyethylene as organic polymers 4 are mixed so that the former and the latter are about 60 volume % and about 35 volume %, respectively. Furthermore, as a titanium coupling agent, isopropoxytrostearoyl titanate is added and kneaded by the use of a roller. In this way, a piezoelectric composition pressure sensitive substance is formed and sheet-like pressure sensitive substance 1 having a thickness of about 0.5 mm is formed by using a hot press.

On the other hand, a 0.2 mm-thick conductive sheets provided with conductivity by filling chlorinated polyethylene with carbon are formed. These conductive sheets are melted on each surface of sheet-like pressure sensitive substance 1 to form electrodes 2A and 2B. Thereafter, in order to express the piezoelectric property, a poling treatment is carried out by applying 5 kV/mm of a direct voltage between electrodes 2A and 2B in the air at 100° C. to form a sheet-like piezoelectric element having a width of 20 mm and a length of 120 mm.

Sheet-like piezoelectric elements formed by using four kinds of water-repellent materials as mentioned above are subjected to a high-temperature and high-humidity test by using thermo-hygrostat chamber under conditions of a temperature of 85° C. and a relative humidity of 85%. For comparison, a sheet-like piezoelectric element in which water-repellent treatment is not carried out on the above-mentioned piezoelectric ceramic powder is also formed and this sheet-like piezoelectric element is subjected to the test similarly.

Figure 5:
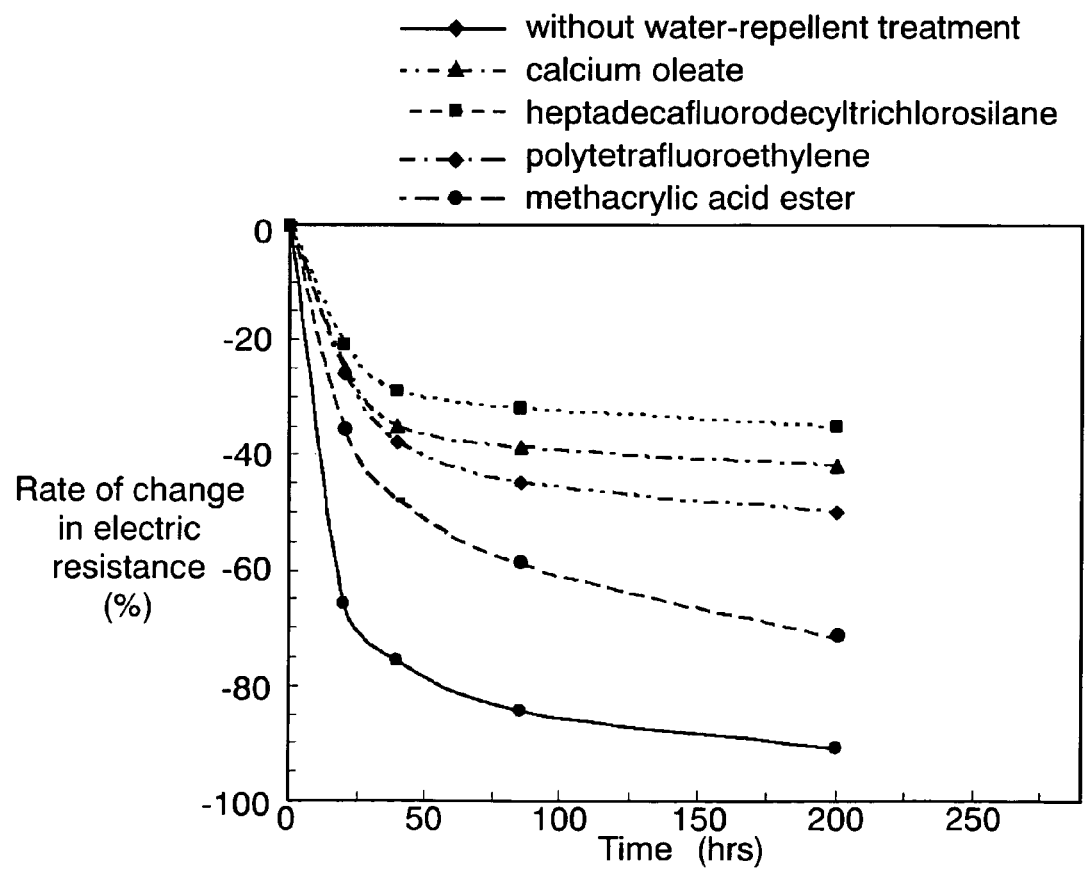
FIG. 5 is a graph showing a change over time of the electric resistance of a sheet-like piezoelectric element during a high-temperature and high-humidity test in the first exemplary embodiment of the present invention.
Figure 6:
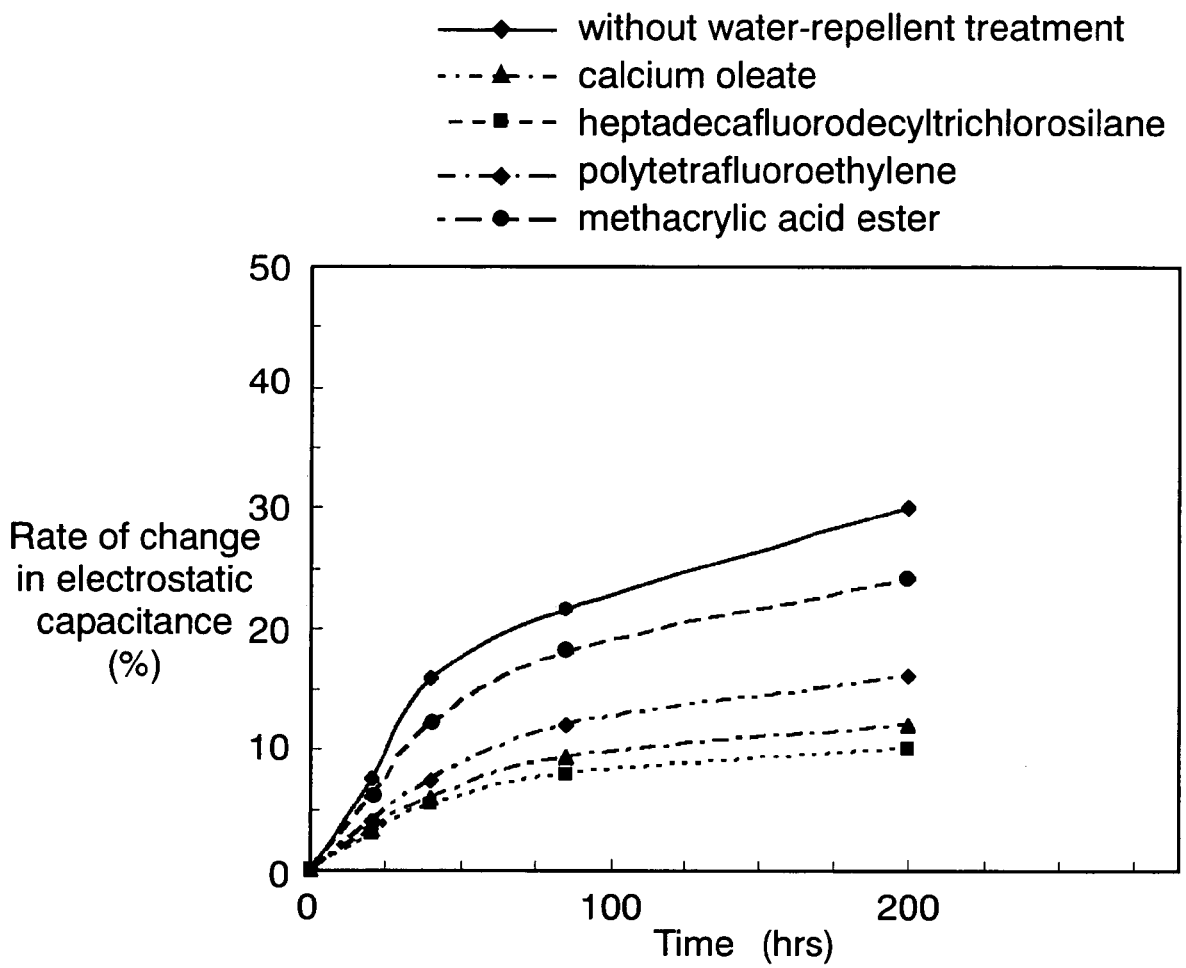
FIG. 6 is a graph showing a change over time of the electrostatic capacitance of a sheet-like piezoelectric element during a high-temperature and high-humidity test in the first exemplary embodiment of the present invention.

FIG. 5 is a graph showing the change over time of the electric resistance in each sheet-like piezoelectric element during a high-temperature and high-humidity test. FIG. 6 is a graph showing the change over time of the electrostatic capacitance of each sheet-like piezoelectric element during a high-temperature and high-humidity test. Note here that the changes in the electric resistance and the electrostatic capacitance are shown by the rate of change with respect to the initial electric resistance value and the initial electrostatic capacitance, respectively. Furthermore, these results are shown by values that are measured values at room temperature of the electric resistance and the electrostatic capacitance of each sheet-like piezoelectric element taken at each time point after the test started. Furthermore, these measurements are carried out at a frequency of 1 kHz.

As is apparent from FIGS. 5 and 6, the changes in the electric resistance and the electrostatic capacitance in the water-repellent treated sheet-like piezoelectric element are smaller as compared with those in the sheet-like piezoelectric element without water-repellent treatment. Furthermore, it is confirmed that water-repellent effect is maintained even after 200 hours has passed. Since the rate of change with respect to a test time tends to saturate, it is shown that the water-repellent effect can be maintained even after the piezoelectric elements are used in a high-temperature and high-humidity environment. This is thought to be because infiltration of water into pressure sensitive substance 1 is suppressed and the elution of components of piezoelectric ceramic powder 5 is reduced.

As mentioned above, by forming covering layer 6 by carrying out a water-repellent treatment with respect to piezoelectric ceramic powder 5, the change in the electric property (electric resistance and electrostatic capacitance) of the piezoelectric element is suppressed. Moreover, the effect lasts over a long time. Therefore, a piezoelectric element having a stable electric property and excellent durability can be obtained.

Next, results of the water-repellent effect of piezoelectric ceramic powder 3 coated with water-repellent material containing the above-mentioned materials are shown. Firstly, a film of piezoelectric ceramic powders 3 provided with covering layer 6 is formed on a glass plate. On the film, distilled water is dropped so as to form a water drop. Then, a contact angle of the formed water drop is measured.

For comparison, a contact angle of piezoelectric ceramic powder 5 whose surface is treated with a titanium coupling agent is measured.

Names of water-repellent materials used in the measurement and measurement results of contact angles are shown in Table 1.

TABLE 1

| | water-repellent material | contact angle (°) |
|---|---|---|
| | nothing | 110 |
| fatty acid salt | calcium oleate | 155 |
| | copper stearate | 155 |
| | zinc palmitate | 150 |
| | calcium isocrotonate | 150 |
| | zinc laurate | 150 |
| fluororesin | polytetrafluoroethylene | 153 |
| | perfluoroalkylethylacrylate | 150 |
| silane compound | heptadecafluorodecyltrichlorosilane | 155 |
| | heptadecafluorodecyltriethoxysilane | 155 |
| | decyltrichlorosilane | 155 |
| acrylic resin | methacrylic acid ester | 125 |
| silicone resin | dimethylpolysiloxane | 140 |
| fatty acid amide | oleamide | 150 |
| | stearamide | 150 |

As is apparent from these results, it is shown that the piezoelectric ceramic powder treated with water-repellent material shows a large contact angle. Such a large contact angle expresses the effect of suppressing infiltration of water into pressure sensitive substance 1.

From the results in FIGS. 5 and 6 and results of Table 1, it is shown that a water-repellent material suppressing the change in the electric property of the piezoelectric element is preferably a material having a contact angle with respect to distilled water of at least 125°. Furthermore, it is further preferable that contact angle is at least 150°.

Next, measurement results of the tensile strength of piezoelectric elements are shown, which were measured after the piezoelectric element using piezoelectric ceramic powders 3 coated with the materials used in the experiments in FIGS. 5 and 6 have been left in a high-temperature and high-humidity environment for 20 hours. The tensile strength is evaluated by a value of force by which the piezoelectric element is expanded by 2 mm. The high-temperature and high-humidity condition is the same as mentioned above, that is, at a temperature of 85° C. and the relative humidity of 85%.

Measurement results are shown in Table 2.

TABLE 2

| water-repellent material | tensile strength (kg) |
|---|---|
| nothing | 1.15 |
| Calcium oleate | 1.35 |
| polytetrafluoroethylene | 1.40 |
| heptadecafluorodecyltrichlorosilane | 1.37 |
| Methacrylic acid ester | 1.28 |

As is apparent from these results, the piezoelectric element using water-repellent treated piezoelectric ceramic powder 3 exhibits a high tensile strength. Infiltration of water into pressure sensitive substance 1 is prevented. Therefore, the tensile strength is prevented from being reduced and thus a piezoelectric element having excellent mechanical strength is realized.

Second Exemplary Embodiment

Figure 7:
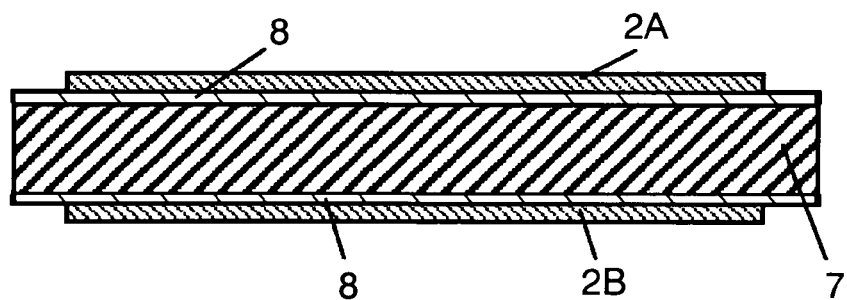
FIG. 7 is a cross-sectional view showing a sheet-like piezoelectric element in accordance with a second exemplary embodiment of the present invention.

FIG. 7 is a cross-sectional view showing a sheet-like piezoelectric element in accordance with a second exemplary embodiment of the present invention. The piezoelectric element shown in FIG. 7 is different from the piezoelectric element of the first exemplary embodiment in that each of covering layers 8 made of a water-repellent material are provided on the surface of piezoelectric composition pressure sensitive substance (hereinafter, referred to as pressure sensitive substance) 7.

Sheet-like pressure sensitive substance 7 includes piezoelectric ceramic powders 5 and flexible organic polymers 4 described in the first exemplary embodiment. Herein, piezoelectric ceramic powder 5 is not water-repellent treated. Covering layer 8 is formed by carrying out a water-repellent treatment on the surface of pressure sensitive substance 7. Electrodes 2A and 2B are formed on the surface of covering layer 8 in the same manner as in the first exemplary embodiment 1. In FIG. 7, covering layer 8 is provided on the faces on which electrodes 2A and 2B are formed, respectively. That is to say, covering layer 8 covers at least a part of the surface of pressure sensitive substance 7.

Figure 8:
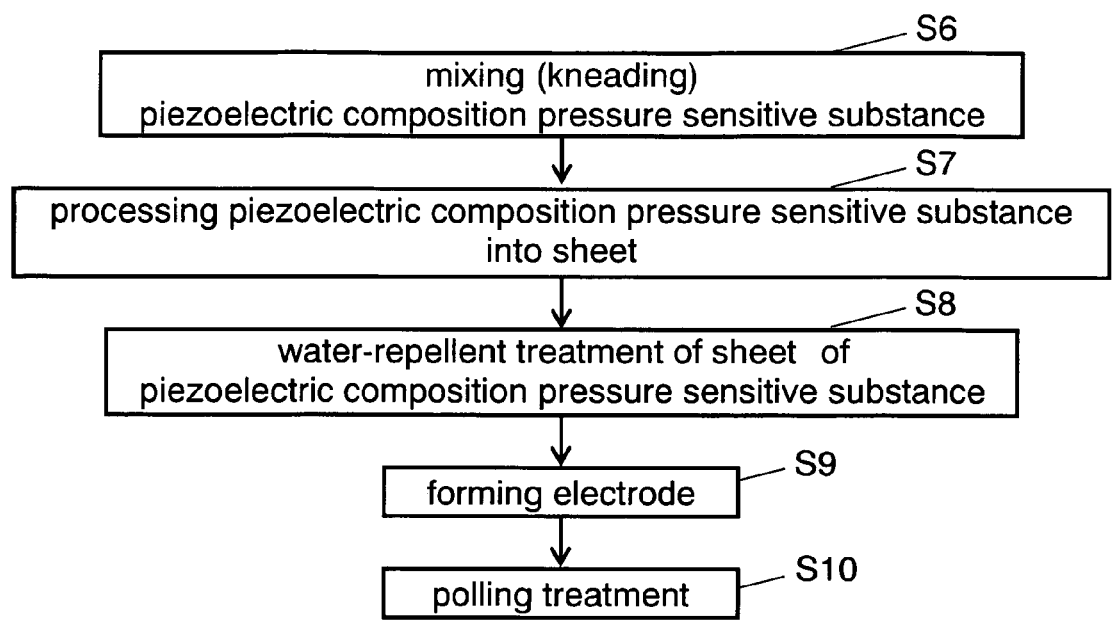
FIG. 8 is a diagram to illustrate a manufacturing process of a piezoelectric element using a piezoelectric composition pressure sensitive substance in accordance with the second exemplary embodiment of the present invention.

A manufacturing process of a sheet-like piezoelectric element in accordance with this exemplary embodiment is described with reference to FIG. 8. Firstly, piezoelectric ceramic powders 5 shown in FIG. 3 and organic polymers 4 are kneaded (S6). At this time, kneading is carried out so that piezoelectric ceramic powders 5 are uniformly mixed and dispersed in organic polymers 4 by using a processor such as a kneader, a roll, or the like. In order to improve kneading, a titanium coupling agent may be added.

Next, this kneaded product is processed by using a processor such as a roll, a hot press, or the like, so as to form sheet-like pressure sensitive substance 7 (S7). Then, a water-repellent treatment is carried out by soaking pressure sensitive substance 7 in a solution containing a water-repellent material, which has been adjusted to a predetermined concentration by diluting with an appropriate solvent, and drying thereof, to form covering layer 8 (S8). Herein, besides the above-mentioned method, covering layer 8 may be formed by soaking pressure sensitive substance 7 into a liquid of a water-repellent material heated to a melting temperature, and drying thereof. Alternatively, covering layer 8 may be formed by attaching a predetermined amount of powders of a water-repellent material to pressure sensitive substance 7.

Next, electrodes 2A and 2B are formed on each face of water-repellent treated pressure sensitive substance 7, respectively (S9). The electrodes are formed by the same method as in step S4 in the first exemplary embodiment. Thereafter, in order to allow the piezoelectric property to be expressed, a poling treatment is carried out by applying a direct voltage between electrodes 2A and 2B in the air or in a silicone oil bath (S10), and a sheet-like piezoelectric element is formed. Note here that the poling treatment (S10) is carried out after electrodes 2A and 2B are formed (S9). However, the poling treatment may be carried out by using two dummy electrodes after sheet-like pressure sensitive substance 7 is formed (S7) or after water-repellent treated covering layer 8 is formed on sheet-like pressure sensitive substance 7 (S8).

When the piezoelectric element having this configuration is used in a high-temperature and high-humidity environment as described in the first exemplary embodiment, water vapor passing through electrodes 2A and 2B is condensed to generate water between electrode 2A and pressure sensitive substance 7 or between electrode 2B and pressure sensitive substance 7. However, since covering layer 8 having a water-repellent property is provided on the surface of pressure sensitive substance 7, infiltration of water into pressure sensitive substance 7 is prevented. That is to say, covering layer 8 suppresses absorption of water by piezoelectric ceramic powder 5. Therefore, the changes in the electric property, piezoelectric property and mechanical strength of a piezoelectric element are reduced and a piezoelectric element having excellent durability and reliability can be obtained. In particular, by preventing the infiltration of water into the inside of pressure sensitive substance 7, the effect of covering layer 8 of preventing the change in the electrostatic capacitance of the piezoelectric element and the softening of the pressure sensitive substance 7 is large.

When water-repellent material is added to piezoelectric ceramic powder 5 and organic polymer 4, and mixed and dispersed by using a processor such as a kneader, a roll, or the like, the water-repellent material exists in a state in which the water-repellent material is dispersed inside of pressure sensitive substance 7. Therefore, even if processing is carried out by using a processor such as a roll, a hot press, or the like, the water-repellent material cannot cover the surface of pressure sensitive substance 7 completely and an excellent water-repellent property cannot be obtained. Therefore, in order to realize excellent water-repellent property, it is necessary to provide covering layer 8 made of a water-repellent material on the surface of pressure sensitive substance 7.

The material forming covering layer 8 is the same as that of covering layer 6 in the first exemplary embodiment. Therefore, detailed description therefor is omitted herein.

Third Exemplary Embodiment

Figure 9:
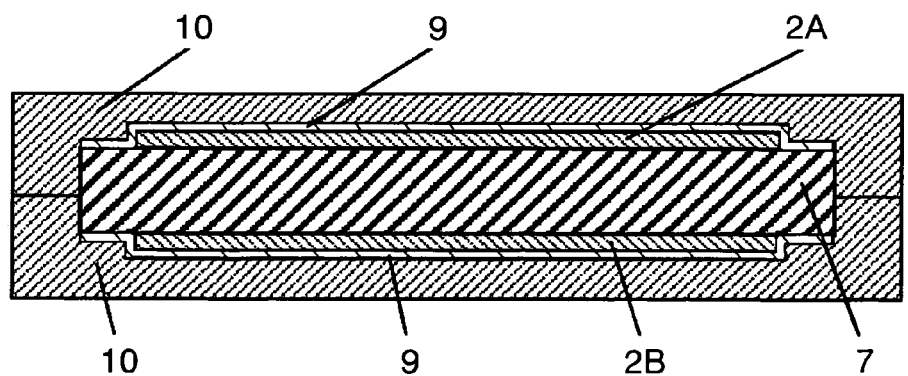
FIG. 9 is a cross-sectional view showing a sheet-like piezoelectric element in accordance with a third exemplary embodiment of the present invention.

FIG. 9 is a cross-sectional view showing a sheet-like piezoelectric element in accordance with a third exemplary embodiment of the present invention. The piezoelectric element shown in FIG. 9 is different from the piezoelectric element of the first exemplary embodiment in that each of covering layers 9 made of a water-repellent material is provided on the surface of piezoelectric composition pressure sensitive substance (hereinafter, referred to as pressure sensitive substance) 7 and electrodes 2A and 2B, and protective layers 10 for covering and protecting them are provided.

Sheet-like pressure sensitive substance 7 includes piezoelectric ceramic powders 5 and flexible organic polymers 4 described in the first exemplary embodiment. Covering layers 9 are formed on the surfaces of electrodes 2A and 2B and a part of the surface of sensitive substance 7 by carrying out water-repellent treatment. Furthermore, protective layers 10 for covering pressure sensitive substance 7, electrode 2A or 2B and covering layer 9 are provided.

Figure 10:
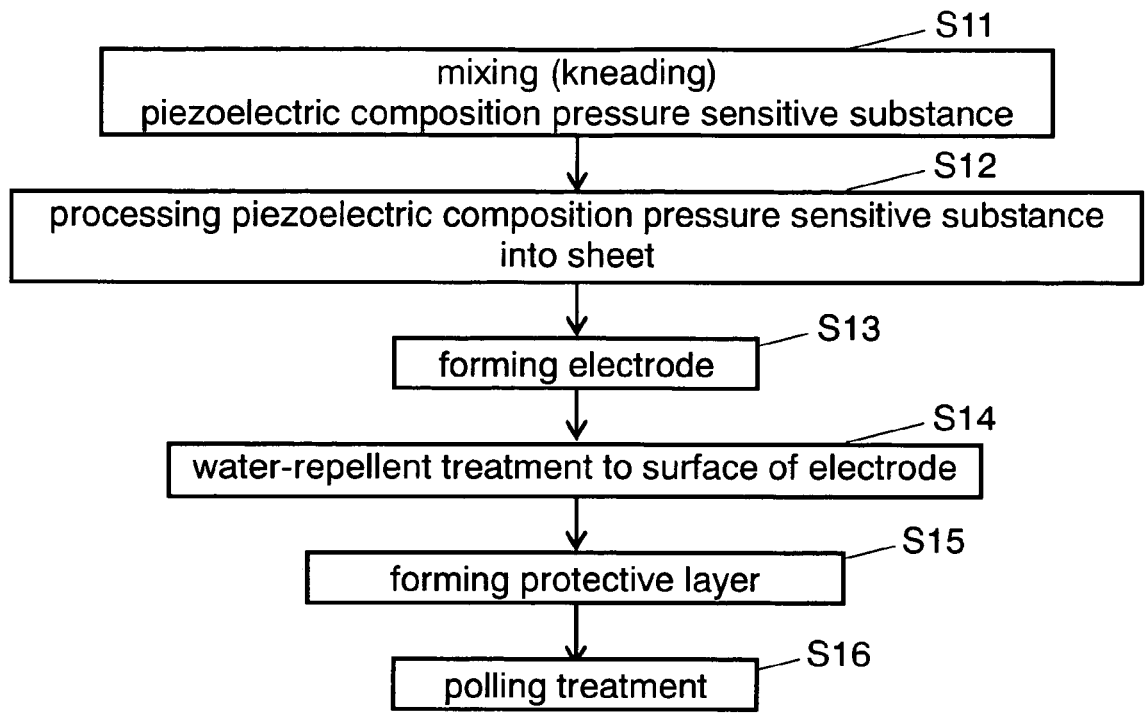
FIG. 10 is a diagram to illustrate a manufacturing process of a piezoelectric element using a piezoelectric composition pressure sensitive substance in accordance with the third exemplary embodiment of the present invention.

A manufacturing process of a sheet-like piezoelectric element in accordance with this exemplary embodiment is described with reference to FIG. 10. Firstly, piezoelectric ceramic powders 5 and organic polymers 4 are kneaded (S11). Then, this kneaded product is processed by using a processor such as a roll, a hot press, or the like, so as to form sheet-like pressure sensitive substance 7 (S12). Steps S11 and S12 are the same as steps S6 and S7 in the second exemplary embodiment, respectively, and therefore the description therefor is omitted.

Next, electrodes 2A and 2B are formed on each face of pressure sensitive substance 7 (S13). The electrodes are formed in the same manner as in step S4 of the first exemplary embodiment. Then, a water-repellent treatment is carried out by soaking piezoelectric ceramic powder 7 provided with electrodes 2A and 2B in a solution containing a water-repellent material, which has been adjusted to a predetermined concentration by diluting with an appropriate solvent, and drying thereof to form covering layer 9 (S14). Herein, besides the above-mentioned method, covering layer 9 may be formed by soaking pressure sensitive substance 7 provided with electrodes 2A and 2B into a liquid of a water-repellent material heated to a melting temperature and drying thereof. Alternatively, covering layer 9 may be formed by attaching a predetermined amount of powders of a water-repellent material to pressure sensitive substance 7 provided with electrodes 2A and 2B. In those ways, on at least the surfaces of electrodes 2A and 2B, covering layers 9 are formed. When electrodes 2A and 2B do not completely cover the surface of pressure sensitive substance 7, covering layers 9 are formed also on the surface of pressure sensitive substance 7 where pressure sensitive substance 7 is exposed.

On the other hand, the material of protective layer 10 is processed into a sheet by using a processor such as a roll, a hot press, or the like. Water-repellent treated pressure sensitive substance 7 and electrodes 2A and 2B are covered with the sheet in a way in which the sheet is folded or water-repellent treated pressure sensitive substance 7 and electrodes 2A and 2B are sandwiched by the sheets (S15). Thereafter, in order to allow the piezoelectric property to be expressed, a poling treatment is carried out by applying a direct voltage between electrodes 2A and 2B in the air or in a silicone oil bath (S16), and thus a sheet-like piezoelectric element is formed. Note here that protective layer 10 may be formed after the poling treatment is carried out. Furthermore, the poling treatment (S16) is carried out after protective layers 10 are formed (S15), but the poling treatment may be carried out by using two dummy electrodes after sheet-like pressure sensitive substance 7 is formed (S12), or the poling treatment may be carried out after electrodes 2A and 2B are formed (S13) or after water-repellent treated covering layers 9 are formed (S14).

For protective layer 10, an organic polymer having elasticity is used in order not to impair the flexibility of pressure sensitive substance 7 and electrodes 2A and 2B. In particular, a thermoplastic elastomer and a rubber material are suitable. The thickness of protective layer 10 is not particularly limited but it is preferably 0.2 to 2 mm in order not to impair the piezoelectric property of pressure sensitive substance 7.

When the piezoelectric element having this configuration is used in a high-temperature and high-humidity environment as described in the first exemplary embodiment, since protective layers 10 are provided, the amount of water vapor diffusing into pressure sensitive substance 7 can be reduced. However, since voids in a three-dimensional network molecular structure of the organic polymer of protective layer 10 are larger than a molecule of water vapor in size, when the thickness of protective layer 10 is in a level of not larger than 2 mm, diffusion of water vapor cannot be prevented completely. Consequently, water is generated between protective layer 10 and respective electrode 2A or 2B and between protective layer 10 and pressure sensitive substance 7. However, covering layers 9 are formed on the surface of pressure sensitive substance 7 and the surfaces of the electrodes 2A and 2B, which are brought into contact with protective layer 10. Therefore, infiltration of water into pressure sensitive substance 7 is suppressed. That is to say, covering layer 9 suppresses absorption of water by piezoelectric ceramic powder 5. Thus, as in the first exemplary embodiment, the changes in the electric property, piezoelectric property and mechanical strength of a piezoelectric element are reduced, and a piezoelectric element having excellent durability and reliability can be obtained. Furthermore, since infiltration of water into electrodes 2A and 2B is also suppressed, the change in the electric resistance of electrodes 2A and 2B is prevented. Therefore, electrodes 2A and 2B always transmit the piezoelectric property of pressure sensitive substance 7 to a detection circuit stably.

Furthermore, since a covering layer formed by carrying out a water-repellent treatment is not provided between electrodes 2A or 2B and pressure sensitive substance 7, loss due to the voltage drop of direct voltage applied at the time of a poling treatment does not occur. Therefore, the efficiency of the poling treatment is improved and a piezoelectric element having a high piezoelectric property can be obtained.

The material forming covering layer 9 is the same as that for covering layer 6 in the first exemplary embodiment, and therefore detailed description therefor is omitted herein. Note here that protective layer 10 used in this exemplary embodiment can be applied to the piezoelectric element described in the first and second exemplary embodiments and the same effects are obtained.

Fourth Exemplary Embodiment

Figure 11:
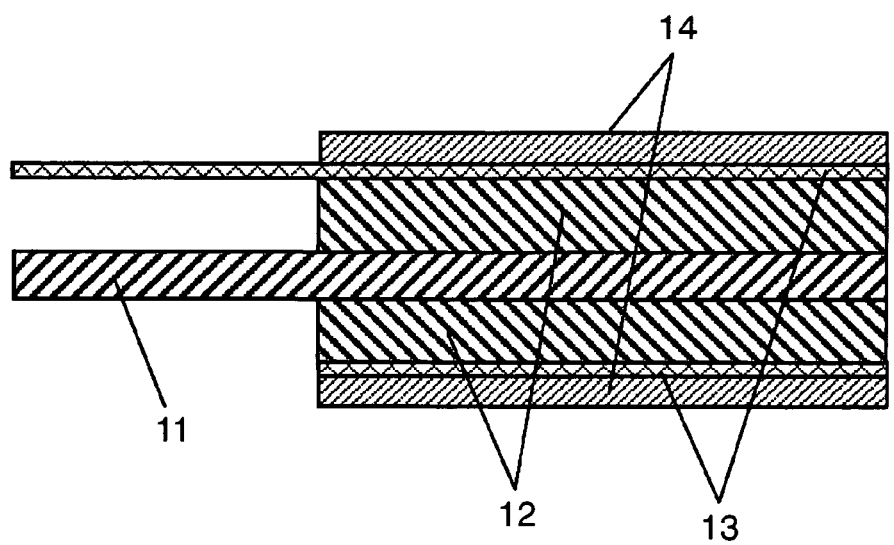
FIG. 11 is a partial cross-sectional view showing a cable-like piezoelectric element in accordance with a fourth exemplary embodiment of the present invention.

FIG. 11 is a partial cross-sectional view showing a cable-like piezoelectric element in accordance with a fourth exemplary embodiment of the present invention. This piezoelectric element includes core electrode 11 as a first electrode, flexible piezoelectric composition pressure sensitive substance (hereinafter, referred to as pressure sensitive substance) 12, flexible external electrode 13 and protective layer 14 made of an electric insulating elastic body. Pressure sensitive substance 12 is formed on the surface of core electrode 11, external electrode 13 is formed on the surface of pressure sensitive substance 12, and protective layer 14 is formed on the surface of external electrode 13. Core electrode 11 and external electrode 13 are insulated from each other by pressure sensitive substance 12.

As core electrode 11, single or a plurality of metal wires, or a convergence line made of a large number of polyester fibers to which metal such as copper is wound, is used. Pressure sensitive substance 12 is composed of materials having the similar composition to that in pressure sensitive substance 1 in the first exemplary embodiment.

External electrode 13 is formed by winding a conductive film on both surfaces of which metal foil is attached, similar to electrodes 2A and 2B in the first exemplary embodiment. The conductive film is wound around cable-like pressure sensitive substance 12. Alternatively, external electrode 13 may be formed of a conductive layer formed by extrusion molding a flexible conductive composition, or may be formed of a conductive film which is made by coating a conductive coating material (paste). External electrode 13 may be formed of a thin vapor-deposited film formed by applying a conductive material on pressure sensitive substance 12 by a method such as vacuum deposition, sputtering, CVD, and the like. The conductive material to be used is the same as that in the first exemplary embodiment. Protective layer 14 is formed by extrusion molding of the same material as that for protective layer 10 in the third exemplary embodiment.

Figure 12:
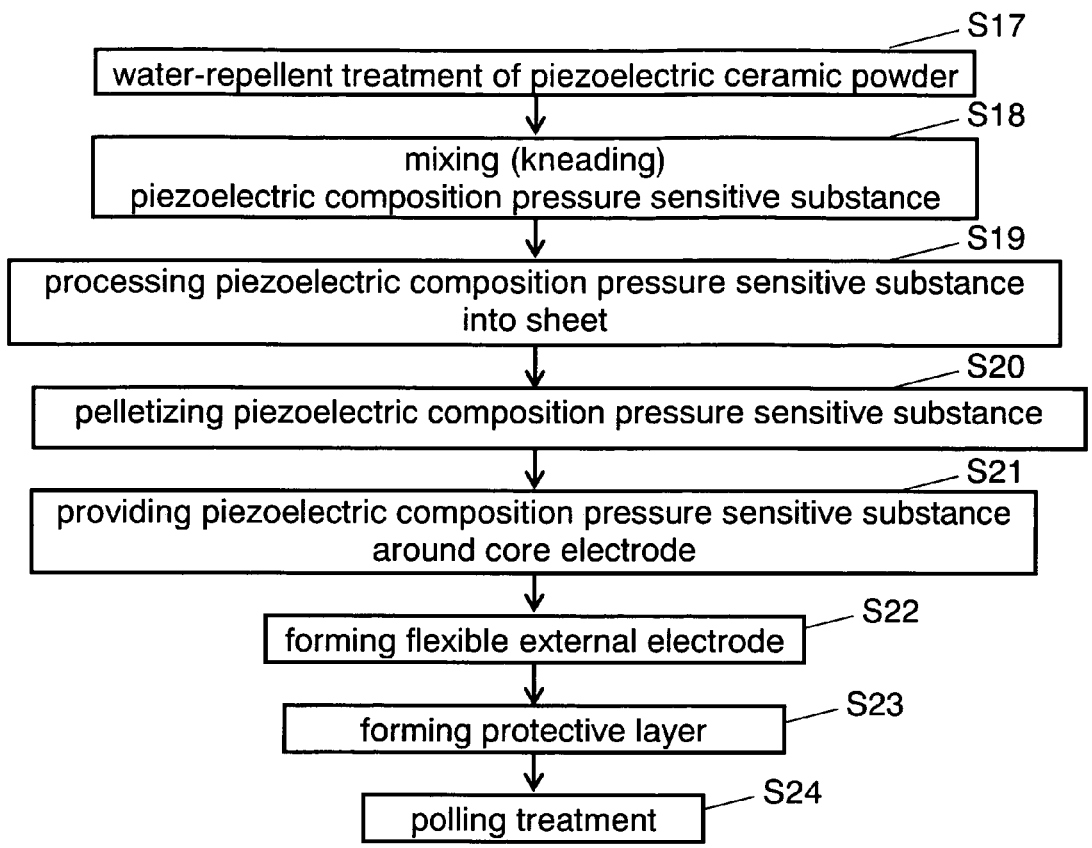
FIG. 12 is a diagram to illustrate a manufacturing process of a piezoelectric element using a piezoelectric composition pressure sensitive substance in the fourth exemplary embodiment of the present invention.

A manufacturing process of a sheet-like piezoelectric element in accordance with this exemplary embodiment is described with reference to FIG. 12. Firstly, piezoelectric ceramic powder 5 described in the first exemplary embodiment is water-repellent treated so as to form covering layer 6 (S17). Then, water-repellent treated piezoelectric ceramic powders 3 and organic polymers 4 are kneaded so that water-repellent treated piezoelectric ceramic powders 3 are uniformly mixed and dispersed in organic polymers 4 (S18). At this time, in order to improve kneading, a titanium coupling agent may be added.

Then, this kneaded product is processed by using a roll processor, so as to form a sheet-like pressure sensitive substance (S19). This sheet-like piezoelectric composition pressure sensitive substance is processed into a pellet form by using a processor such as a pelletizer (S20). Then, by using core electrode 11 as a core material, a pellet-formed piezoelectric composition pressure sensitive substance is extruded by using a processor of an extrusion mold and a layer of pressure sensitive substance 12 is formed around core electrode 11. That is to say, a layer of pressure sensitive substance 12 is provided around core electrode 11 (S21).

Next, by using any of the above-mentioned materials and by any of the above-mentioned processing methods, external electrode 13 is formed (S22). Then, by using an organic polymer having elasticity, for example, a thermoplastic elastomer, rubber, and the like, protective layer 14 is formed by extrusion molding (S23). Thereafter, in order to allow the piezoelectric property to be expressed, a poling treatment is carried out by applying a direct voltage between core electrode 11 and external electrode 13 in the air or in a silicon oil bath (S24), and thus a cable-like piezoelectric element is formed. Note here that protective layer 14 may be provided after a poling treatment is carried out. Furthermore, the poling treatment (S24) is carried out after protective layer 14 is formed (S23), but the poling treatment may be carried out by using dummy electrodes corresponding to the core electrode and the external electrode after a layer of pressure sensitive substance 12 is formed around core electrode 11 (S21), or it may be carried out after external electrode 13 is formed (S22).

In the thus formed cable-like piezoelectric element, protective layer 14 and pressure sensitive substance 12 are removed and core electrode 11 and external electrode 13 are exposed at one end. Thereby, the cable-like piezoelectric element is connected to a control circuit and used as a pressure sensitive sensor.

Hereinafter, the operation and the effect of the cable-like piezoelectric element configured as mentioned above are described. When pressure that changes over time is applied to a part or an entire surface of the cable-like piezoelectric element, an oscillatory voltage according to the acceleration generated in the cable-like piezoelectric element of the part is induced between core electrode 11 and external electrode 13. By using this induced voltage, pressure can be detected.

When the piezoelectric element having the above-mentioned configuration is used in a high-temperature and high-humidity environment as described in the first exemplary embodiment, since protective layer 14 is provided, the amount of water vapor diffusing into pressure sensitive substance 12 is reduced. However, since voids in a three-dimensional network molecular structure of the organic polymer of protective layer 14 are larger than the size of a molecule of water vapor, protective layer 14 cannot prevent the diffusion of water vapor completely. Consequently, water vapor passes through external electrode 13 and is condensed on the surface of pressure sensitive substance 12 to generate water. However, since water-repellent covering layer 6 is formed on the surface of piezoelectric ceramic powders 5 forming pressure sensitive substance 12, infiltration of water can be suppressed. Consequently, the elution of the components of piezoelectric ceramic powders 5 can be reduced. That is to say, covering layer 6 suppresses absorption of water by piezoelectric ceramic powders 5. Therefore, as in the first exemplary embodiment, the changes in the electric property, piezoelectric property and mechanical strength of a cable-like piezoelectric element are reduced. Thus, a cable-like piezoelectric element having excellent durability and reliability can be obtained.

In this way, by carrying out a water-repellent treatment with respect to piezoelectric ceramic powder 5 in advance, each particle can be provided with a water-repellent effect. Therefore, even when a cable-like piezoelectric element having a long length of several kilometers or more is processed, any parts in the cable can have the water-repellent effect. Thus, stable water-repellent effect can be always obtained.

Hereinafter, the above-mentioned configuration and the effect thereof are described with reference to specific examples. As the piezoelectric ceramic powder, a solid solution of bismuth sodium titanate and barium titanate, $(Bi_{1/2}Na_{1/2})_{0.85}Ba_{0.15}TiO_3$, which have an average particle diameter of about 1 μm, and a solid solution of lead titanate and lead zirconate, $Pb(Zr.Ti)O_3$, which have an average particle diameter of about 1 μm, are used. As the water-repellent material, calcium oleate (fatty acid salt) and heptadecafluorodecyltrichlorosilane (silane compound) are used respectively, and a water-repellent treatment is carried out in the same manner as in the first exemplary embodiment so as to form covering layer 6 on the surface of each piezoelectric ceramic powder.

Next, these water-repellent treated piezoelectric ceramic powders 3 and chlorinated polyethylene are mixed so that the former is about 60 volume % and the latter is about 35 volume %, respectively. Furthermore, as the titanium coupling agent, isopropoxytriisostearoyl titanate is added and kneaded by using a roller. A sheet of the piezoelectric composition pressure sensitive substance is formed in this way, followed by forming pellets by using a pelletizer.

On the other hand, core electrode 11 is formed by winding a copper foil around a convergence line composed of a large number of polyester fibers of 0.45-mm diameter. Then, with pellets of a piezoelectric composition pressure sensitive substance, pressure sensitive substance 12 is coated around core electrode 11 to the thickness of about 0.6 mm by using an extrusion molding machine.

Next, a conductive film, in which an aluminum foil having a width of 3 mm and a thickness of 10 μm is attached onto the both surfaces of a polymer film of polyethylene terephthalate having a width of 3 mm and a thickness of 12 μm, is formed. This conductive film is wound around the surface of pressure sensitive substance 12 so that the conductive film is partially overlapped, so as to form external electrode 13. Furthermore, an olefin thermoplastic elastomer is coated around external electrode 13 to the thickness of about 0.5 mm by using an extrusion molding machine so as to form protective layer 14. Thus, a cable-like piezoelectric element is formed. In order to express the piezoelectric property, a poling treatment is carried out by applying 5 kV/mm of direct voltage between core electrode 11 and external electrode 13 in the air at 100° C.

Various cable-like piezoelectric elements formed as mentioned above are adjusted so that the effective length is 150 mm and is subjected to a high-temperature and high-humidity test in a thermo-hygrostat chamber under the conditions of a temperature of 85° C. and a relative humidity of 85% for 20 hours. After the test, the electric resistance and the electrostatic capacitance are measured at ordinary temperature and at a frequency of 1 kHz. For comparison, a cable-like piezoelectric element that is not provided with covering layer 6 is formed and the same test is carried out.

Tables 3 and 4 show the rate of change in the electric resistance and the electrostatic capacitance after the high-temperature and high-humidity test, respectively.

TABLE 3

| covering layer | rate of change in electric resistance (%) | |
| --- | --- | --- |
| | A | B |
| not formed | −85 | −60 |
| calcium oleate | −35 | −25 |
| heptadecafluorodecyltrichlorosilane | −31 | −22 |

A: $(Bi_{1/2}Na_{1/2})_{0.85}Ba_{0.15}TiO_3$
B: $Pb(Zr•Ti)O_3$

TABLE 4

| covering layer | rate of change in electrostatic capacitance (%) | |
| --- | --- | --- |
| | A | B |
| not formed | 20 | 12 |
| calcium oleate | 6 | 3 |
| heptadecafluorodecyltrichlorosilane | 5 | 2 |

A: $(Bi_{1/2}Na_{1/2})_{0.85}Ba_{0.15}TiO_3$
B: $Pb(Zr \cdot Ti)O_3$

As is apparent from these results, the change in the electric resistance and the change in the electrostatic capacitance are small in a piezoelectric element using water-repellent treated piezoelectric ceramic powder 3. Considering the results of the first exemplary embodiment together, the same effect as that of the sheet-like piezoelectric element can be obtained in a cable-like piezoelectric element that is a different shaped piezoelectric element.

The electric resistance of the piezoelectric element is reduced in a high-temperature and high-humidity environment. This is thought to be because components of piezoelectric ceramic powder 5 are dissolved in water. Furthermore, the change in the electric resistance is larger in the piezoelectric element using $(Bi_{1/2}Na_{1/2})_{0.85}Ba_{0.15}TiO_3$ for piezoelectric ceramic powder 5 than in that using $Pb(Zr.Ti)O_3$ for piezoelectric ceramic powder 5. This shows that alkaline component contained in piezoelectric ceramic powder 5 is easily dissolved in water.

On the other hand, the initial specific resistance of the piezoelectric element using piezoelectric ceramic powder 5 of $Pb(Zr.Ti)O_3$ is about twice as large as that of the piezoelectric element using piezoelectric ceramic powder 5 of $(Bi_{1/2}Na_{1/2})_{0.85}Ba_{0.15}TiO_3$. Therefore, it is shown that the specific resistance of the piezoelectric element using piezoelectric ceramic powder 5 of $(Bi_{1/2}Na_{1/2})_{0.85}Ba_{0.15}TiO_3$ is low and is further lowered in a high-temperature and high-humidity environment. When the cable-like piezoelectric element is longer, the electric resistance is further reduced. When the electric resistance is low as well, a circuit with a configuration in which pressure is detected by always applying a constant voltage to a piezoelectric element may not be able to be used as a pressure sensitive sensor. Therefore, when a long-length cable-like piezoelectric element using piezoelectric ceramic powder 5 containing an alkaline component is used in a high-temperature and high-humidity environment, a water-repellent treatment for preventing the elution of alkaline components is essential.

Furthermore, the change in the electrostatic capacitance is also larger in the case where $(Bi_{1/2}Na_{1/2})_{0.85}Ba_{0.15}TiO_3$ is used for piezoelectric ceramic powder 5 than in the case where $Pb(Zr.Ti)O_3$ is used for piezoelectric ceramic powder 5. This is thought to be because there is a difference in the hygroscopic property of the components contained in piezoelectric ceramic powder 5.

It is confirmed that even after the high-temperature and high-humidity test is carried out for 1000 hours, the electric resistance and the electrostatic capacitance observed after having been left for 20 hours can be maintained and that an excellent water-repellent effect is exhibited.

Next, evaluation results of the piezoelectric property in these cable-like piezoelectric elements are shown. The piezoelectric property is evaluated as follows. Vibration is excited while changing a load at a constant frequency in a state in which a constant load is applied to a central portion of the cable-like piezoelectric element. An amount of produced charges is calculated from the relation between the voltage generated at that time and the load. The piezoelectric property is evaluated by the calculated amount of produced charges. Table 5 shows the rate of change in the amount of produced charges after 20 hours of the high-temperature and high-humidity test.

TABLE 5

| covering layer | rate of change in amount of produced charges (%) | |
| --- | --- | --- |
| | A | B |
| not formed | 96 | 65 |
| calcium oleate | 14 | 10 |
| heptadecafluorodecyltrichlorosilane | 15 | 8 |

A: $(Bi_{1/2}Na_{1/2})_{0.85}Ba_{0.15}TiO_3$
B: $Pb(Zr \cdot Ti)O_3$

As is apparent from these results, the change in the amount of produced charges of a water-repellent treated piezoelectric element is small and a stable piezoelectric property can be obtained even in a high-temperature and high-humidity environment.

Next, results of the voltage output constant evaluated by using piezoelectric ceramic powders having different relative permittivities in the cable-like piezoelectric element are shown. As piezoelectric ceramic powders 5 having different relative permittivities, $Pb(Zr.Ti)O_3$, $(Bi_{1/2}Na_{1/2})_{0.85}Ba_{0.15}TiO_3$ and $NaNbO_3$ are used. These materials are water-repellent treated with calcium oleate to form covering layer 6, and piezoelectric ceramic powders 3 are obtained.

Next, a cable-like piezoelectric element is formed as mentioned above so that water-repellent treated piezoelectric ceramic powders 3 is about 60 volume % and chlorinated polyethylene is about 35 volume %. Then, in order to allow the formed piezoelectric element to express the piezoelectric property, a poling treatment is carried out by applying 5 kV/mm of direct voltage between core electrode 11 and external electrode 13 in the air at 100° C. The thus formed cable-like piezoelectric element is adjusted so that the effective length is 150 mm and the voltage output constant is evaluated. Table 6 shows the ratios of voltage output constant of the piezoelectric element using other materials than $Pb(Zr.Ti)O_3$ for piezoelectric ceramic powder 5 where voltage output constant of the cable-like piezoelectric element using $Pb(Zr.Ti)O_3$ for piezoelectric ceramic powder 5 is defined as a reference.

TABLE 6

| composition of piezoelectric ceramic powder | relative permittivity | ratio of voltage output constant |
| --- | --- | --- |
| $Pb(Zr \cdot Ti)O_3$ | 1950 | 1 |
| $(Bi_{1/2}Na_{1/2})_{0.85}Ba_{0.15}TiO_3$ | 700 | 3.1 |
| $NaNbO_3$ | 120 | 5.7 |

As is apparent from these results, the lower the relative permittivity of piezoelectric ceramic powder 5 is, the higher the voltage output constant is. Therefore, as the relative permittivity of piezoelectric ceramic powder 5 is smaller, larger voltage is applied and the polling efficiency is improved. Therefore, by using ceramic powder 5 having low relative permittivity, the voltage output constant of the piezoelectric element, that is, the sensitivity as a pressure sensitive sensor is improved. A preferable range of the relative permittivity and a mechanism for improving the voltage output constant are the same as those in the first exemplary embodiment.

Fifth Exemplary Embodiment

Figure 13:
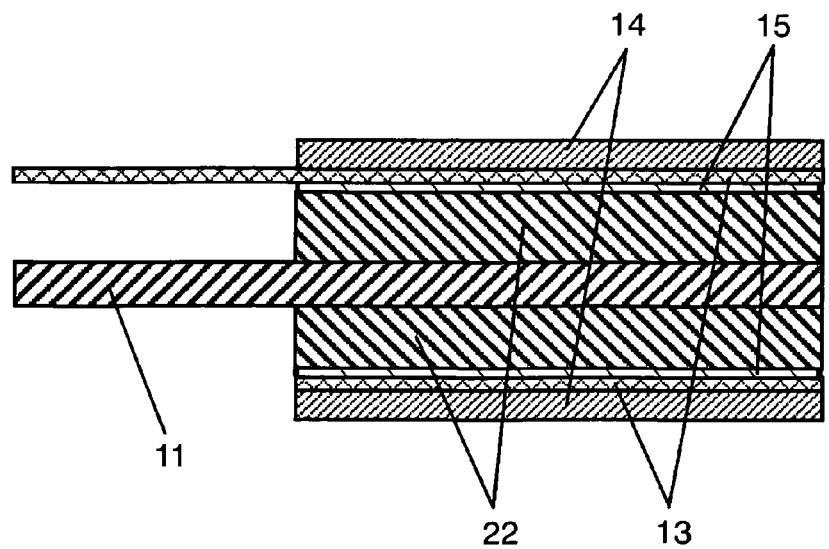
FIG. 13 is a partial cross-sectional view showing a cable-like piezoelectric element in accordance with a fifth exemplary embodiment of the present invention.

FIG. 13 is a partial cross-sectional view showing a cable-like piezoelectric element in accordance with a fifth exemplary embodiment of the present invention. The piezoelectric element shown in FIG. 13 is different from the piezoelectric element of the fourth exemplary embodiment in that covering layer 15 made of a water-repellent material is provided on the surface of piezoelectric composition pressure sensitive substance (hereinafter, referred to as pressure sensitive substance) 22.

The cable-like piezoelectric element of this exemplary embodiment includes core electrode 11, flexible pressure sensitive substance 22, covering layer 15, external electrode 13 and protective layer 14. Pressure sensitive substance 22 is formed on the surface of core electrode 11, and covering layer 15 is formed on the surface of pressure sensitive substance 22 by carrying out a water-repellent treatment. Pressure sensitive substance 22 includes piezoelectric ceramic powders 5 and organic polymers 4. Piezoelectric ceramic powder 5 is not water-repellent treated. External electrode 13 is formed on the surface of covering layer 15, and protective layer 14 made of an electric insulating elastic body is formed on the surface of external electrode 13. In FIG. 13, covering layer 15 is formed only on the surface of pressure sensitive substance 22 where external electrode 13 is formed. That is to say, covering layer 15 covers at least a part of the surface of pressure sensitive substance 22.

Figure 14:
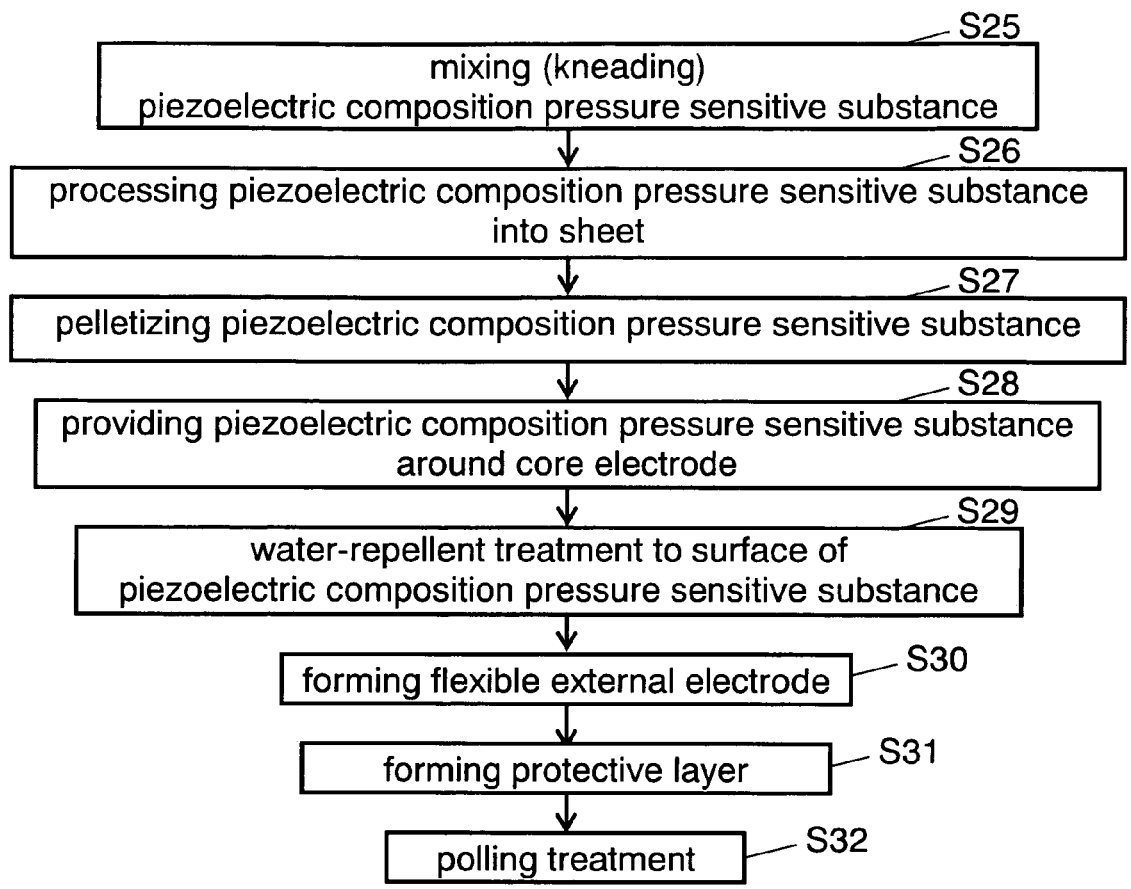
FIG. 14 is a diagram to illustrate a manufacturing process of a piezoelectric element using a piezoelectric composition pressure sensitive substance in the fifth exemplary embodiment of the present invention.

Hereinafter, a manufacturing process of a cable-like piezoelectric element of this exemplary embodiment is described with reference to FIG. 14. Firstly, piezoelectric ceramic powders 5 shown in FIG. 3 and organic polymers 4 are kneaded (S25). This step is the same as step S6 in the second exemplary embodiment.

Then, a sheet-like piezoelectric composition pressure sensitive substance is formed by using a roll processor (S26). This sheet-like piezoelectric composition pressure sensitive substance is processed into a pellet form by using a processor such as a pelletizer (S27). Then, by using core electrode 11 as a core material, a pellet-formed piezoelectric composition pressure sensitive substance is extruded by using a processor of the extrusion mold to form a layer of pressure sensitive substance 22 around core electrode 11. That is to say, a layer of pressure sensitive substance 22 is provided around core electrode 11 (S28). Then, covering layer 15 obtained by carrying out a water-repellent treatment is formed on the surface of pressure sensitive substance 22 (S29). Step S29 is similar to step S8 in the second exemplary embodiment.

Next, external electrode 13 is formed on cable-like pressure sensitive substance 22 (S30). Furthermore, protective layer 14 is formed (S31). Thereafter, a poling treatment is carried out (S32), and a cable-like piezoelectric element is formed. Steps S30, S31 and S32 are the same as S22, S23 and S24 in the fourth exemplary embodiment, respectively. Note here that protective layer 14 may be formed after the poling treatment is carried out. Furthermore, the poling treatment (S32) is carried out after protective layer 14 is formed (S31), but the poling treatment may be carried out by using dummy electrodes corresponding to the core electrode and the external electrode after a layer of pressure sensitive substance 22 is formed around core electrode 11 (S28) or after water-repellent treated covering layer 15 is formed (S29). Alternatively, the poling treatment may be carried out after external electrode 13 is formed (S30).

In the thus formed cable-like piezoelectric element, protective layer 14 and pressure sensitive substance 22 are removed and core electrode 11 and external electrode 13 are exposed at one end. Thereby, the cable-like piezoelectric element is connected to a control circuit and used as a pressure sensitive sensor.

When the cable-like piezoelectric element having the above-mentioned configuration is used in a high-temperature and high-humidity environment as in the first exemplary embodiment, since protective layer 14 is provided, the amount of water vapor diffusing into pressure sensitive substance 22 is reduced. However, voids in a three-dimensional network molecular structure of the organic polymer of protective layer 14 are larger than the size of a molecule of water vapor. Therefore, when the thickness of protective layer 14 is in the level of not more than 2 mm, the diffusion of water vapor cannot be prevented completely and water is generated between pressure sensitive substance 22 and external electrode 13. However, since water-repellent treated covering layer 15 is formed on the surface of pressure sensitive substance 22, infiltration of water into pressure sensitive substance 22 is suppressed. The elution of components of piezoelectric ceramic powder 5 contained in pressure sensitive substance 22 is thus reduced. That is to say, covering layer 15 suppresses absorption of water by piezoelectric ceramic powder 5. Therefore, as in the fourth exemplary embodiment, the changes in the electric property, piezoelectric property and mechanical strength of a cable-like piezoelectric element are reduced, and a cable-like piezoelectric element having excellent durability and reliability can be obtained.

When a cable-like piezoelectric element is manufactured, it is required to be wound up by a roll after pressure sensitive substance 22 is coated on core electrode 11 by extrusion molding. These are works continuously done. Therefore, between the extrusion of pressure sensitive substance 22 and the roll winding work, a water-repellent treatment process is carried out, and the roll winding work can be carried out while the water-repellent treatment is carried out. That is to say, without remarkably changing the manufacturing process, a water-repellent treatment can be carried out continuously with respect to the surface of pressure sensitive substance 22. As a result, the productivity is not impaired.

Since extrusion molding is carried out while pressure sensitive substance 22 is heated, it is necessary to cool cable-like pressure sensitive substance 22 between the extrusion molding and the roll winding work. Herein, when the water-repellent material is liquid and the treatment temperature is low, the water-repellent treating process can encompass a cooling process. According to this manufacturing method, the productivity is secured.

Even when water-repellent materials are added to piezoelectric ceramic powders 5 and organic polymers 4 and mixed and dispersed by using a processor such as a kneader, a roll, or the like, the water-repellent materials exist in a state in which they are dispersed inside pressure sensitive substance 22. Therefore, even if the materials are extruded by using a processor of the extrusion molding and forming a covering layer of pressure sensitive substance 22 around core electrode 11, the water-repellent materials cannot completely cover the surface of pressure sensitive substance 22, and the excellent water-repellent property cannot be exhibited. Therefore, in order to realize the excellent water-repellent property, it is necessary to provide covering layer 15 of a water-repellent material on the surface of pressure sensitive substance 22. The effects thereof are described specifically.

A cable-like piezoelectric element is formed by using calcium oleate as a water-repellent material, $(Bi_{1/2}$ $Na_{1/2})_{0.85}Ba_{0.15}TiO_3$ as piezoelectric ceramic powder 5, and an olefin thermoplastic elastomer as protective layer 14. The formed piezoelectric element is subjected to a high-temperature and high-humidity test in the same conditions as in the first exemplary embodiment for 20 hours and the water-repellent effect is evaluated based on the change in the electric resistance at that time. For comparison, a piezoelectric element that is not provided with covering layer 15 and a piezoelectric element which uses a piezoelectric composition pressure sensitive substance formed by adding a water-repellent material to piezoelectric ceramic powder 5 and organic polymer 4 and is not provided with covering layer 15 are formed, and the same evaluation is carried out. Note here that the electric resistance is measured at a frequency of 1 kHz. Table 7 shows the rate of change in the electric resistance after the high-temperature and high-humidity test is carried out.

TABLE 7

| part where coating treatment is carried out | rate of change in electric resistance (%) |
| --- | --- |
| none | −85 |
| mixed in pressure sensitive substance | −83 |
| surface of pressure sensitive substance | −42 |

As is apparent from these results, only in the piezoelectric element in which covering layer 15 is provided on the surface of pressure sensitive substance 22, a significant reduction in the electric resistance is suppressed. Thus, it is necessary to form a water-repellent material on the surface of pressure sensitive substance 22 instead of mixing a water-repellent material in a material forming pressure sensitive substance 22.

Sixth Exemplary Embodiment

Figure 15:
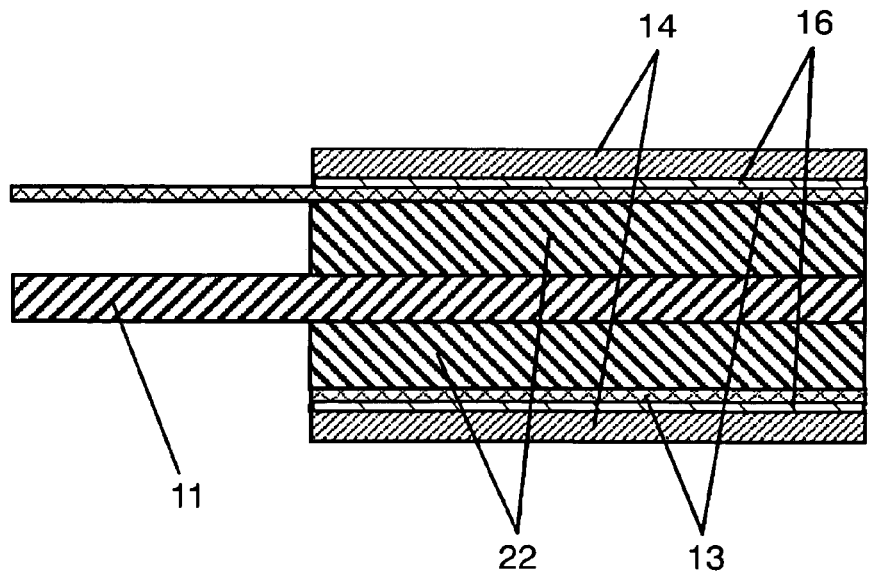
FIG. 15 is a partial cross-sectional view showing a cable-like piezoelectric element in accordance with a sixth exemplary embodiment of the present invention.

FIG. 15 is a partial cross-sectional view showing a cable-like piezoelectric element in accordance with a sixth exemplary embodiment of the present invention. The cable-like piezoelectric element shown in FIG. 15 is different from the piezoelectric element in the fifth exemplary embodiment in that covering layer 16 made of a water-repellent material is provided on the surface of external electrode 13 instead of the surface of piezoelectric composition pressure sensitive substance (hereinafter, referred to as pressure sensitive substance) 22. The other configurations are the same as those in the fifth exemplary embodiment. In FIG. 15, covering layer 16 is provided on the entire surface of external electrode 13, but covering layer 16 may be provided on a part thereof and a part on which covering layer 16 is not provided may be covered with a water vapor non-permeable film. That is to say, covering layer 16 covers at least a part of the external electrode.

Figure 16:
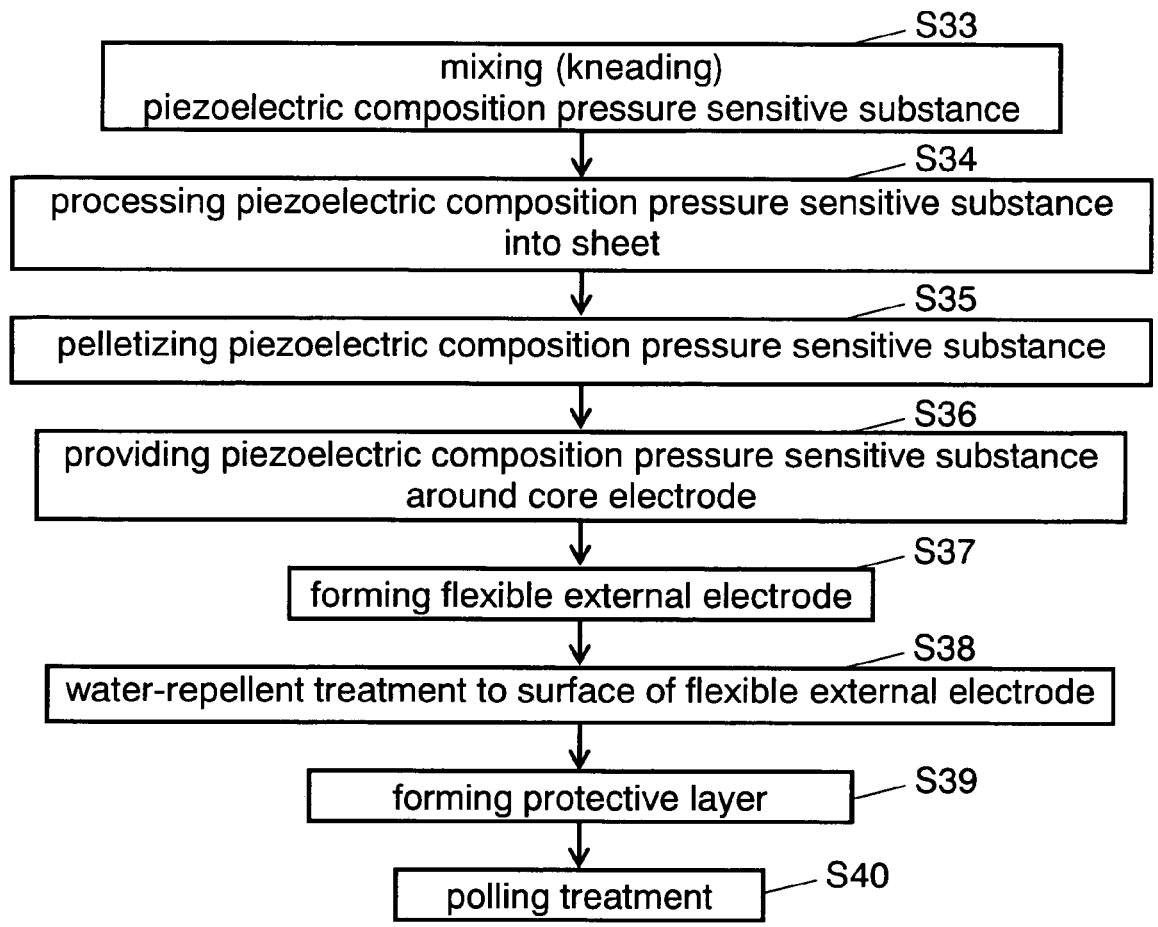
FIG. 16 is a diagram to illustrate a manufacturing process of a piezoelectric element using a piezoelectric composition pressure sensitive substance in the sixth exemplary embodiment of the present invention.

FIG. 16 illustrates a manufacturing process of a cable-like piezoelectric element in accordance with this exemplary embodiment. Step S33 of mixing materials forming pressure sensitive substance 22, step 34 of processing the mixed materials into a sheet, step S35 of further pelletization, and step S36 of coating these pellets onto core electrode 11 to form a layer are the same as steps S25, S26, S27 and S28 in the fifth exemplary embodiment, respectively.

Next, as in step S30 in the fifth exemplary embodiment, external electrode 13 is formed on cable-like pressure sensitive substance 22 (S37). Then, the surface of external electrode 13 is water-repellent treated to form covering layer 16 (S38). This step is similar to step S29 in the fifth exemplary embodiment.

Furthermore, protective layer 14 is formed (S39) and a poling treatment is carried out (S40). These steps are the same as steps S31 and S32 in the fifth exemplary embodiment, respectively. That it to say, the manufacturing process of the cable-like piezoelectric element in this exemplary embodiment corresponds to a manufacturing process of the cable-like piezoelectric element in the fifth exemplary embodiment in which order of steps S29 and S30 is reversed. Note here that protective layer 14 may be provided after a poling treatment is carried out. Furthermore, the poling treatment (S40) is carried out after protective layer 14 is formed (S39), but a poling treatment may be carried out by using dummy electrodes corresponding to a core electrode and an external electrode after a layer of pressure sensitive substance 22 is formed around core electrode 11, or a polling treatment may be carried out after external electrode 13 is formed (S37), or after water-repellent treated covering layer 16 is formed (S38).

In the thus formed cable-like piezoelectric element, protective layer 14 and pressure sensitive substance 22 are removed and core electrode 11 and external electrode 13 are exposed at one end. Thereby, the cable-like piezoelectric element is connected to a control circuit and used as a pressure sensitive sensor.

When the cable-like piezoelectric element having the above-mentioned configuration is used in a high-temperature and high-humidity environment as in the fourth exemplary embodiment, since protective layer 14 is provided, the amount of water vapor diffusing into pressure sensitive substance 22 is reduced. However, since voids in a three-dimensional network molecular structure of the organic polymer of protective layer 14 are larger than the size of a molecule of water vapor, when a thickness of protective layer 14 is in the level of not more than 2 mm, protective layer 14 cannot prevent the diffusion of water vapor completely and water is generated between protective layer 14 and external electrode 13. However, since covering layer 16 is formed on the surface of external electrode 13, infiltration of water into pressure sensitive substance 22 is suppressed. Therefore, the elution of components of piezoelectric ceramic powder 5 contained in pressure sensitive substance 22 is reduced. That is to say, covering layer 16 suppresses absorption of water by piezoelectric ceramic powder 5. Therefore, as in the fourth exemplary embodiment, the changes in the electric property, piezoelectric property and mechanical strength of a cable-like piezoelectric element are reduced. Thus, a cable-like piezoelectric element having excellent durability and reliability can be obtained.

Furthermore, since infiltration of water into external electrode 13 is also suppressed, the change in the electric resistance of external electrode 13 is prevented, and a stable piezoelectric property is always transmitted to a detection circuit.

Furthermore, when the cable-like piezoelectric element is manufactured, it is required to be wound up by a roll after external electrode 13 is provided around pressure sensitive substance 22. These are works continuously done. Herein, between the providing of external electrode 13 and the roll winding work, a water-repellent treatment process can be provided. In this way, since the roll winding work can be carried out while the water-repellent treatment is carried out, it is not necessary to change the manufacturing process remarkably. That is to say, since the water-repellent treatment can be carried out with respect to the surface of pressure sensitive substance 22 continuously, the productivity is not impaired.

Next, evaluation results of water-repellent effects when a water-repellent covering layer is formed on each part of a cable-like piezoelectric element are shown. A piezoelectric element is produced by using calcium oleate as a water-repellent material and $(Bi_{1/2}Na_{1/2})_{0.85}Ba_{0.15}TiO_3$ as a piezoelectric ceramic powder. The formed piezoelectric element is subjected to a high-temperature and high-humidity test for 20 hours in the same conditions as in the first exemplary embodiment and the water-repellent effect is evaluated based on the change in the electric resistance at that time. For comparison, a piezoelectric element that is not provided with covering layer 15 and a piezoelectric element in which a water-repellent covering layer is formed on the surface of protective layer 14 provided around external electrode 13, and the same evaluation is carried out. Note here that the electric resistance is measured at a frequency of 1 kHz. Table 8 shows the rate of change in the electric resistance after the high-temperature and high-humidity test is carried out.

TABLE 8

| part where coating treatment is carried out | rate of change in electric resistance (%) |
|---|---|
| none | −85 |
| surface of external electrode | −54 |
| surface of protective layer | −84 |

As is apparent from these results, in the piezoelectric element in which covering layer 15 is formed on the surface of external electrode 13, the reduction in the electric resistance is suppressed. On the other hand, the piezoelectric element in which a water-repellent covering layer is formed on the surface of protective layer 14 shows the rate of change in the electric resistance of the same level as that of the piezoelectric element in which a water-repellent treatment is not carried out, showing that no water-repellent treatment effect is exhibited.

This shows that water vapor passes through the covering layer formed by carrying out a water-repellent treatment and protective layer 14. That is to say, it is thought that the water-repellent effect by a covering layer is exhibited only in the case where water is generated outside the covering layer because water vapor diffusing inside the piezoelectric element is condensed by temperature gradient or in a supersaturation state. Therefore, it is necessary for the water-repellent covering layer to be provided inside the piezoelectric element including the surface of the electrode.

In the structure shown in FIG. 15, when protective layer 14 is not provided, the result of the high-temperature and high-humidity test is not so different from that of in the case where the covering layer is provided on the protective layer as mentioned above. Also in this case, water vapor passes through covering layer 16 and diffuses inside the piezoelectric element to generate water and thereby the property is deteriorated. Therefore, when covering layer 16 is provided so as to cover external electrode 13, protective layer 14 is needed as a place where water vapor entering the inside of the piezoelectric element is condensed. From the results of the fifth exemplary embodiment and this exemplary embodiment, it is necessary for a covering layer having a water-repellent property to be provided at the inner side from the outermost layer of the piezoelectric element. This is the same as in the configuration of the third exemplary embodiment. When covering layer 9 is provided so as to cover electrodes 2A and 2B, protective layer 10 is required.

Note here that in the fourth to sixth exemplary embodiments, when external electrode 13 is formed by extrusion molding a flexible conductive composition produced by kneading conductive powders and organic polymers, when external electrode 13 is formed by coating a conductive coating material obtained by dispersing electric conductive powders in organic polymers, or when external electrode 13 is formed from conductive materials by vapor deposition such as vacuum deposition, sputtering, CVD, and the like, it has excellent adhesion with respect to pressure sensitive substance 22. Therefore, when a cable-like piezoelectric element is protected by another member, protective layer 14 may not be formed.

The cable-like piezoelectric elements of the fourth to sixth exemplary embodiments have flexibility and cable shape. Therefore, they can be provided to a place including a bending part or a place with a limited attachment width. Furthermore, they have an excellent property that the electric property, piezoelectric property and mechanical strength are maintained even when they are used in a high-temperature and high-humidity environment. Therefore, such piezoelectric elements are suitable for a sensor to be used outside, a sensor for detecting something caught in an automobile door, and the like, which require such providing conditions or properties.

Figure 17:
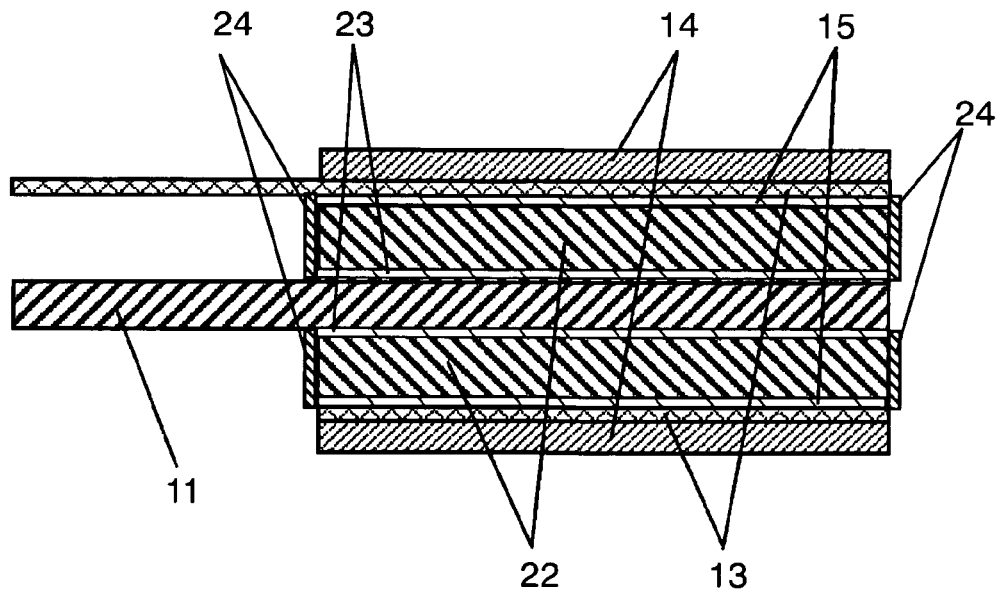
FIG. 17 is a partial cross-sectional view showing another cable-like piezoelectric element in accordance with the fifth exemplary embodiment of the present invention.

In the cable-like piezoelectric elements in the fifth and sixth exemplary embodiments, it is assumed that the piezoelectric element is used in a configuration in which the cross section of the piezoelectric elements is exposed. In this case, it is thought that water vapor infiltrates from a boundary portion between core electrode 11 and pressure sensitive substance 22 exposed to the cross section, and that the water vapor is condensed on the surface of pressure sensitive substance 22 that is brought into contact with the side of core electrode 11. In such a case, as shown in a partial cross-sectional view in FIG. 17, by providing second covering layer 23 made of a water-repellent material between core electrode 11 and pressure sensitive substance 22, the elution of piezoelectric ceramic powders 5 or impurities by water can be suppressed. Furthermore, it is effective that third covering layer 24 made of a water-repellent material is formed also on a cut end surface of pressure sensitive substance 22. Note here that FIG. 17 is based on the configuration of the fifth exemplary embodiment, but similarly may be based on the configuration of the sixth exemplary embodiment. Furthermore, also in the case of the sheet-like piezoelectric elements in the second and third exemplary embodiments, it is further preferable that an end face of pressure sensitive substance 7 is also covered with a covering layer.

Note here that in the above-mentioned embodiment, the effect of suppressing elution of piezoelectric ceramic powders 5 or impurities by water, which is realized by providing a covering layer of a water-repellent material, is described in detail. Besides, other configurations can also suppress the elution of piezoelectric ceramic powders 5 or impurities by water.

That is to say, besides a covering layer made of a water-repellent material, also by increasing a thicknesses of protective layers 10 and 14 to increase the resistance to permeation of water vapor, absorption of water by piezoelectric ceramic powder 5 can be suppressed. Alternatively, by physical vapor deposition (sputtering, vapor deposition), chemical vapor deposition or chemical synthetic processing, a dense film through which it is difficult for molecules of water vapor to pass may be formed as a covering layer. The dense film formed by physical vapor deposition, chemical vapor deposition or chemical synthetic processing can suppress infiltration of water vapor itself. Therefore, unlike a covering layer made of a water-repellent material, even in the case where such a dense film is provided on the outermost layer of the piezoelectric element, the effect to prevent the elution of piezoelectric ceramic powders 5 or impurities by water can be realized. In the second and third exemplary embodiments, the above-mentioned configuration may be applied to either one of electrodes 2A and 2B side.

However, when protective layers 10 and 14 are too thick, the sensitivity of the piezoelectric element is lowered. Therefore, it is necessary to design them strictly. Furthermore, since a dense film impairs its effect when it includes a pin hole, highly accurate formation is required.

It is necessary that a body motion sensor used in a care bed and the like, secures the detection of a large area. To this, the cable-like piezoelectric elements of the fourth to sixth exemplary embodiments are capable of detecting a large area by providing them on the bed in a meander shape. Furthermore, when maintenance such as washing or folding up are taken into consideration, they have a configuration also suitable for the body motion sensor used for the care bed.

The present invention is not limited to these exemplary embodiments.

INDUSTRIAL APPLICABILITY

Since the piezoelectric element of the present invention can suppress absorption of water by a piezoelectric composition pressure sensitive substance even when it is used in a high-temperature and high-humidity environment, changes in the electric property, piezoelectric property and mechanical tensile strength are small. That is to say, the piezoelectric element has excellent durability and reliability. Therefore, it is suitable for the use in a high-temperature and high-humidity environment, for example, for the outdoor use. It can be applied for a wide variety of uses in a pressure sensitive sensor for preventing something from being caught in a door or window of automobile, or a sensor for detecting a user's body motion on a care bed and judging where or not a user is present on the bed.

The invention claimed is:

1. A piezoelectric element, comprising:
    a piezoelectric composition pressure sensitive substance including a piezoelectric ceramic powder and a flexible organic polymer;
    a first electrode connected to the piezoelectric composition pressure sensitive substance;
    a second electrode connected to the piezoelectric composition pressure sensitive substance and electrically insulated from the first electrode; and
    a covering layer of a water-repellant material provided on a surface of the piezoelectric ceramic powder.

2. The piezoelectric element according to claim 1, wherein the covering layer has a contact angle with respect to distilled water of at least 125° and less than 180°.

3. The piezoelectric element according to claim 1, wherein the covering layer is formed in a form of a monomolecular layer.

4. The piezoelectric element according to claim 1, wherein the piezoelectric ceramic powder is a compound having a perovskite structure containing at least one of an element of Group I of the Periodic Table and an element of Group IIA of the Periodic Table.

5. The piezoelectric element according to claim 1, wherein the piezoelectric ceramic powder includes at least one of bismuth sodium titanate, barium titanate, sodium niobate and potassium niobate as a main component.

6. The piezoelectric element according to claim 1, wherein the organic polymer includes at least one of a thermoplastic elastomer and rubber.

7. The piezoelectric element according to claim 6, wherein the thermoplastic elastomer includes at least one of chlorinated polyethylene and chlorosulfonated polyethylene.

8. The piezoelectric element according to claim 1, wherein the piezoelectric composition pressure sensitive substance further includes a titanium coupling agent.

9. The piezoelectric element according to claim 8, wherein the titanium coupling agent includes at least one of isopropoxytriisostearoyl titanate and isopropoxytris- dioctylpyrophosphate titanate.

10. The piezoelectric element according to claim 1, wherein the piezoelectric ceramic powder has a relative permittivity of more than 0 and at most 1000.

11. The piezoelectric element of claim 1, wherein the water-repellant covering layer comprises a fluororesin, a silane compound, or an acrylic resin.

12. The piezoelectric element of claim 11, wherein the water-repellant covering layer comprises and heptadecafluorodecyl-trichlorosilane.

13. The piezoelectric element of claim 1, wherein the water-repellant covering layer comprises a fatty acid salt.

14. The piezoelectric element of claim 13, wherein the water-repellant covering layer comprises calcium oleate.

* * * * *